United States Patent [19]
Lape

[11] Patent Number: 5,093,984
[45] Date of Patent: Mar. 10, 1992

[54] PRINTED CIRCUIT BOARD LOADER/UNLOADER

[75] Inventor: Larry J. Lape, Sugar Land, Tex.

[73] Assignee: Aehr Test Systems, Menlo Park, Calif.

[21] Appl. No.: 526,069

[22] Filed: May 18, 1990

[51] Int. Cl.$^5$ .............................................. H05K 3/30
[52] U.S. Cl. ........................................ 29/741; 27/743; 27/757; 27/762; 324/158 F
[58] Field of Search ............... 29/741, 739, 762, 743, 29/759; 324/158 F

[56] References Cited

U.S. PATENT DOCUMENTS

| | | | |
|---|---|---|---|
| 4,584,764 | 4/1986 | Gussman | 29/705 |
| 4,817,273 | 4/1989 | Lape et al. | 29/741 |
| 4,819,699 | 4/1989 | Brown et al. | 29/741 X |

Primary Examiner—Carl E. Hall
Attorney, Agent, or Firm—Tim L. Burgess

[57] ABSTRACT

A printed circuit board loader and unloader in which a printed circuit board carrier is horizontally translationally moved in a straight line along a first axis and a pick and place head unit is horizontally translationally moved above the carrier in a straight horizontal line along a second axis perpendicular to the first axis. A device stager holds a tube containing integrated circuit devices fed to it by a tube transporter. In a straight path from the opening of the tube facing the carrier is a slideway operatively connected with the tube holder. The slideway has gating and device fixing vacuum ports. The device stager is pivotable to (i) a pivot down position to slide devices from the tube onto the slideway and vacuum arrest and gate them, (ii) a pivot level position in which the devices are picked up from over the forward ports on the slideway, and (iii) a pivot up position which devices slide from the forward portion of the slideway into a tube in the tube holder of the device stager. The pick and place system loads the printed circuit board by vertically picking up devices from the level slideway, traveling horizontally to a pre-calculated position, and placing the devices in sockets on the printed circuit board on the carrier positioned at that calculated position, employing in one aspect a special zero insertion force socket opener. The pick and place system unloads the board by vertically extracting the devices from the precisely positioned board, horizontally moving them to the slideway, and vertically depositing the devices on the level slideway, which then pivots up to deposit them in a tube being loaded.

28 Claims, 10 Drawing Sheets

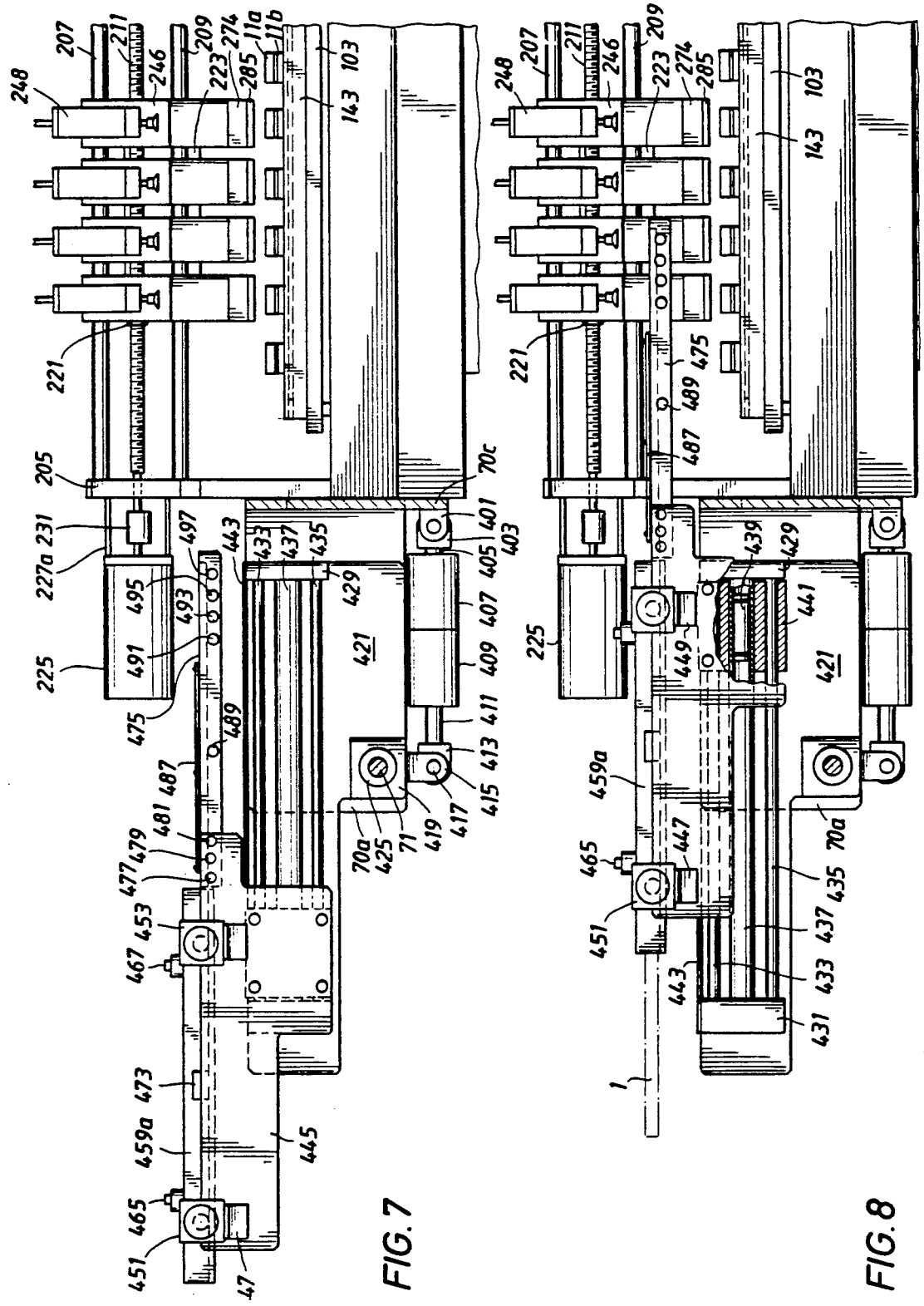

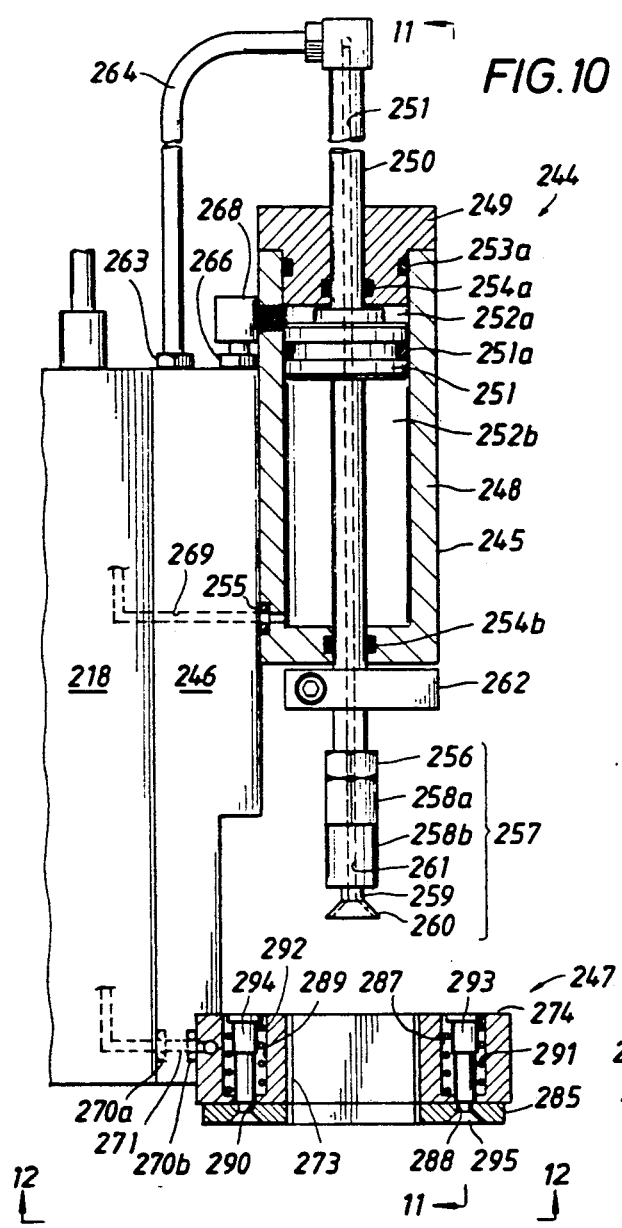
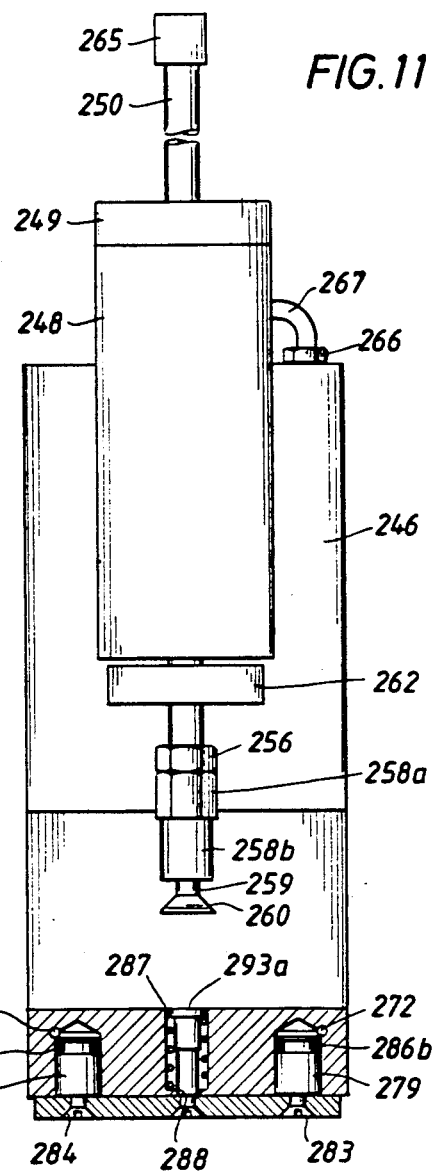
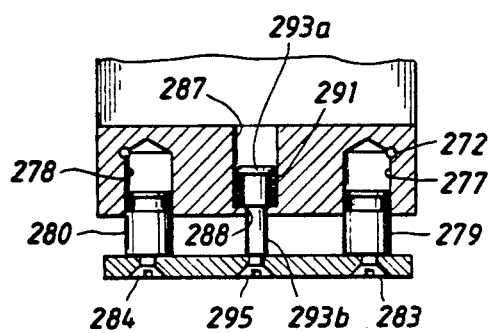

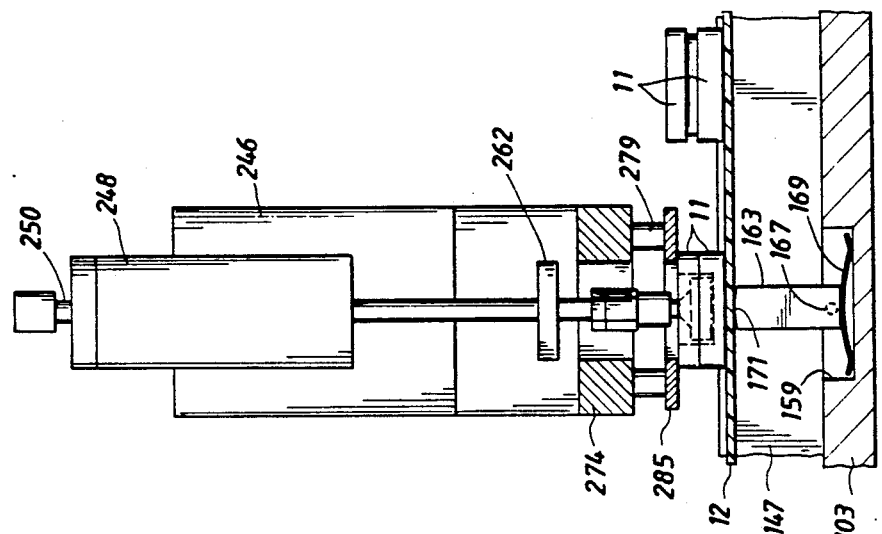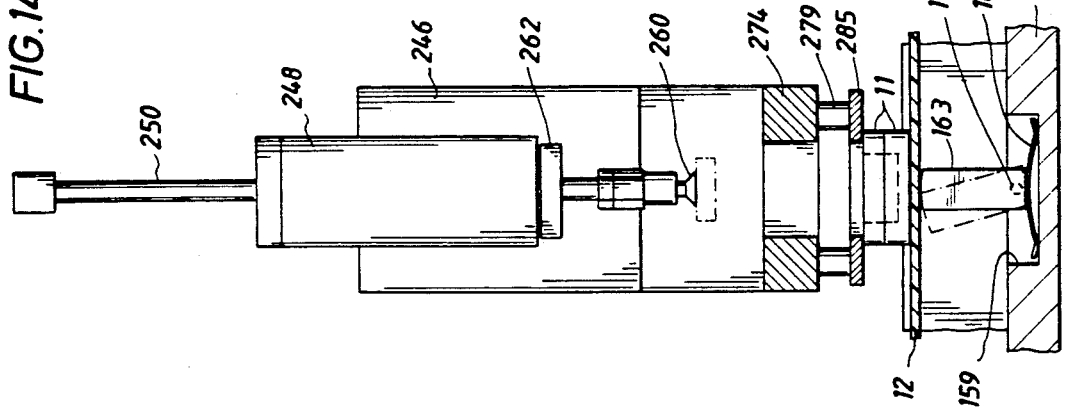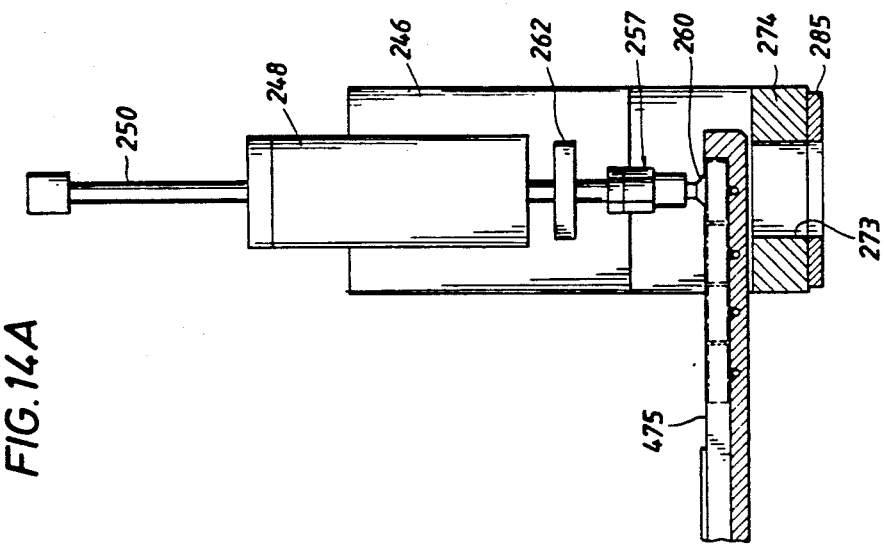

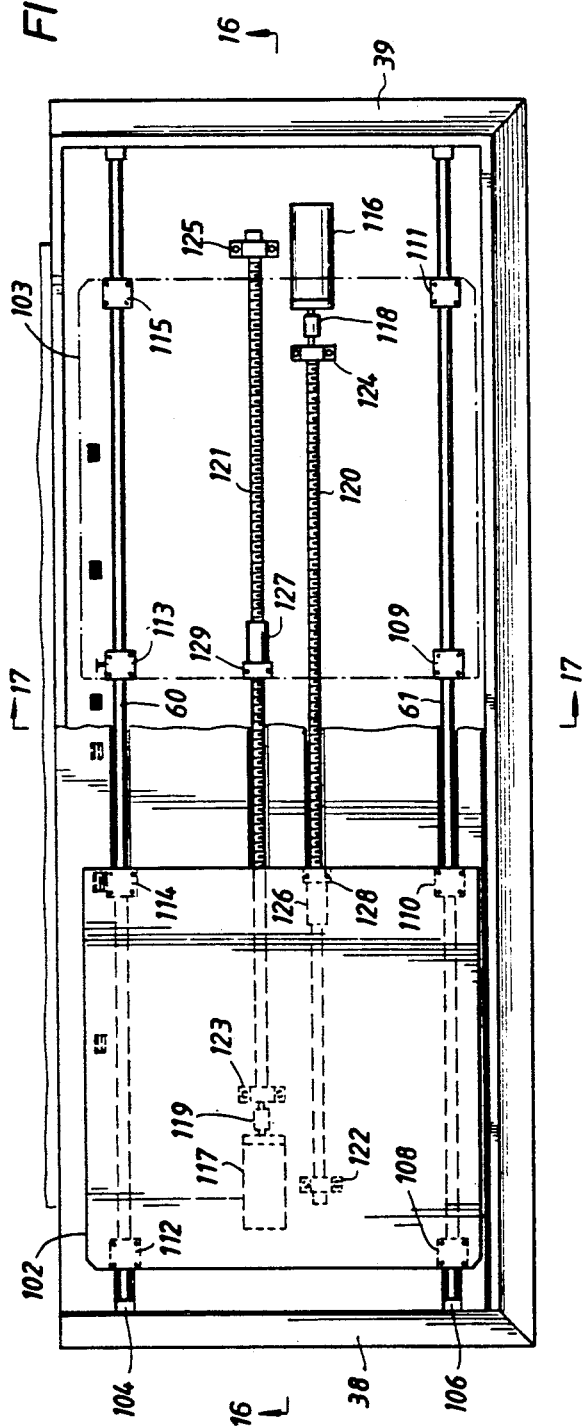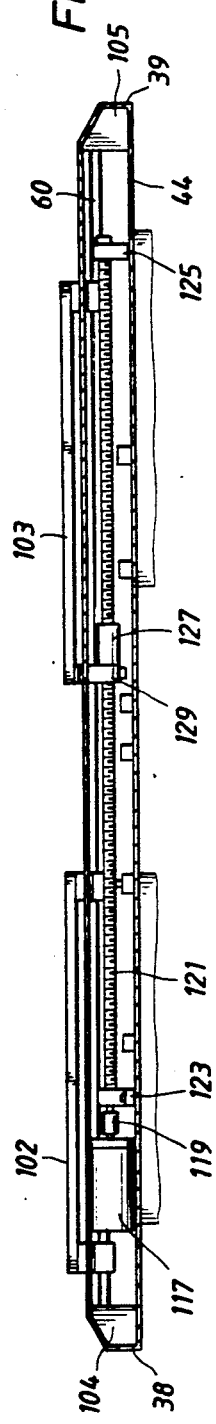

PRINTED CIRCUIT BOARD LOADER/UNLOADER

BACKGROUND OF THE INVENTION

This invention relates generally to the field of automated apparatus for handling electronic circuit components and, more particularly, to automated apparatus for use in the art of burning-in circuit components prior to their distribution and use. Still More specifically, this invention is directed to automated insertion and removal of electronic integrated circuit ("IC") packages or devices into or out of sockets on printed circuit boards, especially printed circuit boards used for burn-in testing of IC packages or devices and called "Burn-in Boards" or "BIB's".

IC packages or devices (for brevity, hereinafter both being referred to simply as "devices") may be classified according to force required to insert them into their sockets. Direct entry devices require insertion force and include such devices as dual in-line packages ("DIPs"), which comprise a parallelpiped body portion typically having from four to sixty four electrical leads of a generally L-shaped cross-section extending out and down from the opposing sides of the body. The sockets mounted on the burn-in boards may therefore include socket contact slots for receiving electrical leads on DIPs. Another direct entry device is the small outline J-lead chip carrier ("SOJ").

Zero insertion force devices do not require force to insert them into their sockets ("ZIF" sockets). Zero insertion force devices generally are surface mounted devices ("SMD's"). SMD's are gaining in popularity for packaging integrated circuits, because they mount directly to the surface of the printed circuit board, which eliminates expense of drilling mounting holes through the board. SMD's also are in some instances much smaller than DIP's, allowing tighter packaging densities. SMD's include small outline integrated circuits ("SOIC's"), plastic lead chip carriers ("PLCC's"), ceramic leaded chip carriers ("CLCC's"), leadless chip carriers ("LCC's") and, plastic quad flat packs ("PQFP's"). The SOIC also comprises a generally parallelpiped body portion having electrical leads extending from opposing sides of the body. The electrical lead may have either a J-shaped or a S-shaped ("gull wing") cross-section. The PLCC, CLCC, LCC and PQFP's have bodies which have square or rectangular geometry with a relatively thin cross section, giving these IC packages an overall wafer-shaped appearance. In the usual construction, the PLCC, CLCC and PQFP have multiple electrical leads positioned flush with or bent into close proximity with the body of the package, while the LCC has conductive coatings applied at selected areas on the major body surfaces.

SMD's mount to the surface of the boards in SMD sockets. In these sockets, the SMD's lay on the surface of a support in the socket instead of being inserted into slots in the socket as are DIP's. Spring biased socket contacts press against the SMD's leads that extend from the sides of the SM body. One basic type of SMD socket is the ZIF socket in which the spring biased socket contacts are spread apart by depressing a socket lid to allow clearance for SMD placement and removal. Another type is a so called ZIF "over-the-top" cover socket which is hinged to open the socket lid for SMD placement or removal and which includes a latch to secure it shut.

As is well known and detailed somewhat more in my earlier patent, U.S. Pat. No. 4,817,273 and in the references cited therein, IC devices are mass-produced and installed in electronic circuits used in highly sophisticated, complex and costly equipment. As with many mass-produced products, IC devices are prone to failure, in some cases within the first 1000 hours of operation. The complexity of equipment within which such devices are installed makes post-installation failures highly undesirable. Quality and dependability are enhanced substantially by early detection of those IC devices likely to fail in the first few hours of operation, prior to installation of the devices in electronic equipment. One of the methods for detecting flawed IC devices is referred to generally as "burn-in". Burn-in refers generally to the technique in which IC packages or devices are stressed, and sometimes tested, within their physical and electrical limits prior to their sale or distribution, so that those devices likely to become early failures in complicated equipment can be discovered, and so that IC devices, in some cases, can be graded and sorted according to performance specifications. The burn-in technique generally includes loading the IC devices into sockets on burn-in boards; placing the burn-in boards in a chamber whose environment, particularly temperature, is controllable; applying electrical test signals to the boards while subjecting the IC devices to the maximum temperature reading for them; removing the burn-in board from the chamber; and unloading the IC devices from the burn-in boards. In addition, it is sometimes desirable to sort the IC devices by performance grade after burn-in.

The burn-in test processes however, although successful in reducing expenses associated with flawed IC devices, are not themselves without expense. Substantial capital expenditures are necessary to purchase or to construct burn-in chambers, burn-in boards, and test equipment. Personnel must be employed and trained to operate the equipment and to monitor the time-consuming processes. So substantial are the investments that independent businesses provide burn-in and test services to a variety of manufacturers. Cost effectiveness of the burn-in and test processes is therefore essential.

One means of improving the cost effectiveness of the burn-in and test processes is to reduce labor expenses and to improve efficiency and quality control through the use of automation. Accordingly, efforts have been made to automate various aspects of the burn-in process, as shown, for example, by U.S. Pat. Nos. 4,320,805; 4,439,917; 4,584,764; 4,567,652; 4,660,282; 4,780,956; 4,781,494; 4,801,234; and 4,817,273; and also West Germany Patent Application DE 8,626,502 and Great Britain Patent Application GB 2,157,275A.

Automated handling enables the use of a computer to track and document the progress of each IC devices through the burn-in process. In situations involving a high volume of IC devices for burn-in, automated handling equipment may be used to achieve a higher through-put of IC devices more efficiently than could be achieved otherwise. A single automated loader, for example, can easily replace a goodly number of very efficient employees assigned to the tedious task of loading burn-in boards. In any situation, automated handling equipment provides improved reliability and consistency of work product.

None of the prior methods of automated loading or unloading provide the advantages of my present invention, the features and benefits of which will become apparent from the detailed descriptions which follow after I first summarize the invention.

SUMMARY OF THE INVENTION

In accordance with this invention, apparatus and method are provided for loading and unloading IC devices into and out of sockets on printed circuit boards, suitably burn-in boards. The apparatus comprises a support; a carrier system translationally moveably affixed to the support for carrying a printed circuit board horizontally in a first horizontal straight line axis; in a preferred aspect, a device staging system including a longitudinal straight slideway having a first end and a second end pivotally affixed to said support and pivotal at least to (i) a first position in which said first end is lower than said second end and (ii) a second position in which said first end and the said second end are at the same level, for gravity feeding IC devices from the second end of the slideway to the first end when the slideway is pivoted to the first position to stage the devices for pickup in said second position; a pickup and place system translationally moveably affixed to the support for (i) vertically picking up a plurality of IC devices from the first end of the slideway when the slideway is in the second position, (ii) horizontally carrying the devices above the carrier system in a second horizontal straight line axis perpendicular to the first horizontal straight line axis, and (iii) vertically placing the IC devices each into separate sockets on the printed circuit board; and a control system for operating and controlling the device staging means, the carrier means and the pick up and place means. Preferably, the pickup and place system includes structure for extracting devices from sockets on the printed circuit board and placing the devices on the slideway when the slideway is in the second position, and preferably the device staging system is pivotable to a third position in which the second end is lower than the first end are for unloading the printed circuit board.

The invention involves a process of loading IC devices into sockets on a printed circuit board, including supporting a printed circuit board horizontally; supplying a source of IC devices in longitudinal orientation with a longitudinal straight slideway having first and second ends and pivotal to the aforementioned first position, in which the first end is lower than to the aforementioned second end, and to a second position, in which the first and second ends are at the same level, the first end of the slideway including in the slideway a plurality of longitudinally arrayed vacuum ports, the slideway also having a gating vacuum port between the second end and the longitudinal array of vacuum ports in the first end; pivoting the slideway to the aforementioned first position to slide IC devices from the IC source onto and down the slideway under the force of gravity; applying vacuum to one or more of the ports in the first end of the slideway to arrest descent of the devices in the slideway; applying vacuum to the gating port to arrest the device over the gating port and any trailing devices in the slideway and removing vacuum at the ports in the first end to slide devices below the gating port to positions over all the ports in the first end available to be filled, then reapplying vacuum to secure the devices over the ports; pivoting the slideway to the second position; picking up vertically a plurality of devices from over the ports in the first end of the slideway upon release of vacuum to these ports; the printed circuit board upon the support horizontally in a first straight line axis to a predetermined position along the first axis; and transporting the plurality of devices horizontally over the printed circuit board in a second straight line axis, perpendicular to the first straight line axis, to a predetermined position along the second straight line axis; and vertically placing the plurality of devices in sockets on the printed circuit board.

DESCRIPTION OF THE DRAWINGS

FIG. 7 is a partial side elevational view of the apparatus taken along the line 7—7 of FIG. 5 in pivot ready position;

FIG. 8 is a partial side elevational view taken along the line of 8—8 of FIG. 6, and accordingly shows in elevation the device staging portion of the apparatus in tube loading position;

FIG. 10 is a side elevational view and partial cross-section of a load/unload plant head assembly;

FIG. 11 is a frontal elevational view of the load/unload plant head assembly of FIG. 10, with a portion thereof in cross-section along the line 11—11 of FIG. 10;

FIG. 12 is a bottom view of the load/unload plant head assembly, taken along the line 12—12 of FIG. 10;

FIG. 13 is the same view of the lower portion of FIG. 11 that is in cross-sectional view, but in a different operating position;

FIG. 14A is a front elevational view of the load/unload plant head assembly positioned with the device staging assembly for loading or unloading steps;

FIG. 14B is the same view of the load/unload head assembly of FIG. 14A, with the assembly in load/unload position over a socket on a burn-in board;

FIG. 14C is the load/unload plant head assembly of FIGS. 14A and 14B shown in device planting positioned over a socket on a burn-in board; , FIG. 15 is a plan elevational view of the burn-in board or tray carrier assemblies and drive systems with portions of the support platform for the carriers removed to disclose pertinent portions of the apparatus;

FIG. 16 is a lateral or X-axis cross-sectional view of the carrier and support platform of FIG. 15 taken along the line 16—16 of FIG. 15;

FIG. 17 is a cross-sectional view of the carrier and support apparatus of FIG. 15 taken along the line 17—17 of FIG. 15.

DESCRIPTION OF THE PREFERRED EMBODIMENT

The architecture of the inventive structural concept permits one unit of cooperating systems of the invention to be joined with another like unit of cooperating systems to maximize flexibility and throughput in one machine. The preferred embodiment described in this portion of the specification of the invention benefits from this architectural advantage and arranges the joined inventive units bilaterally, so the machine has a left side and a right side as viewed from the front.

Because of this bilateral dualism, this portion of the specification adopts a convention in aid of brevity of detailed description. In this convention, structure on the left side of the apparatus and numbered 100 or greater has an even number, and like structure on the right side has an odd number which is one integer higher than the even number for the same structure on the left side. For example, item 103 on the right side corresponds to item 102 on the left side. Cooperating systems making up a left side unit of operation are "A" systems, e.g. system 100A, and cooperating systems making up a right side unit of operation are "B" systems, e.g., system 100B.

Figure 1:
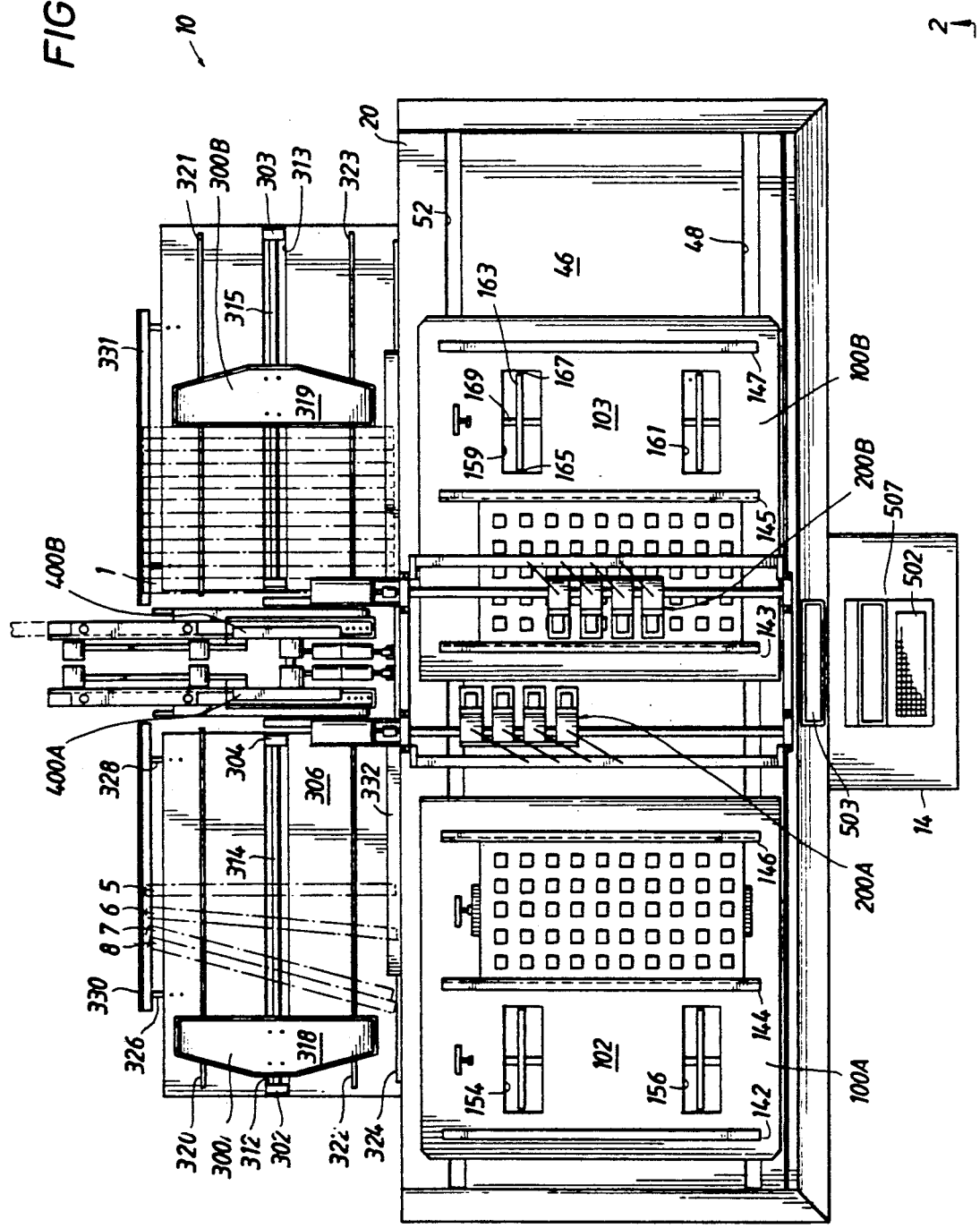
FIG. 1 is a plan view of a loader/unloader apparatus constructed in accordance with the principles of the present invention.

Referring to FIG. 1 for orientation, reference numeral 10 indicates a bilateral loader/unloader apparatus for automatically loading and unloading integrated circuit packages or devices into sockets 11 of one or more burn-in boards 12. Loader/unloader apparatus 10 includes a support structure indicated generally by reference numeral 20, dual burn-in board or tray carrier systems indicated generally by reference numerals 100A and 100B, dual load/unload pick and place plant head systems indicated generally by reference numerals 200A and 200B, dual tube transport systems indicated generally by reference numerals 300A and 300B, and dual device staging systems indicated generally by reference numerals 400A and 400B.

Apparatus 10 is operated by a system controller 500 the centerpiece of which is a microprocessor 501. The control system for apparatus 10 is illustrated in block diagram in FIG. 18, and is discussed in more detail hereinbelow.

Referring still to FIG. 1, computer 510 with keyboard 502 and monitor 504 is supported on a retractable pullout shelf 14 shown pulled-out at the front of loader/unloader apparatus 10. Device staging systems 300A and 300B and tube transport systems 400A and 400B are toward the rear of loader/unloader apparatus 10. The front-to-rear or rear-to-front direction for apparatus 10 is denominated herein as the "Y" axis direction. The axis which is perpendicular to the "Y" axis in the plane of the paper of FIG. 1 is denominated herein as the "X" axis direction. Thus, "Y" axis movement is a front-to-back and back-to-front movement, and "X" axis movement is a lateral movement, right-to-left or left-to-right. Movement which is perpendicular to the plane of the paper of FIG. 1 is denominated "Z" axis movement, and represents up and down or vertical movement.

With this general orientation of apparatus 10, the supporting structure and operating systems of apparatus 10 are now detailed.

Support Structure

Figures 2, 3:
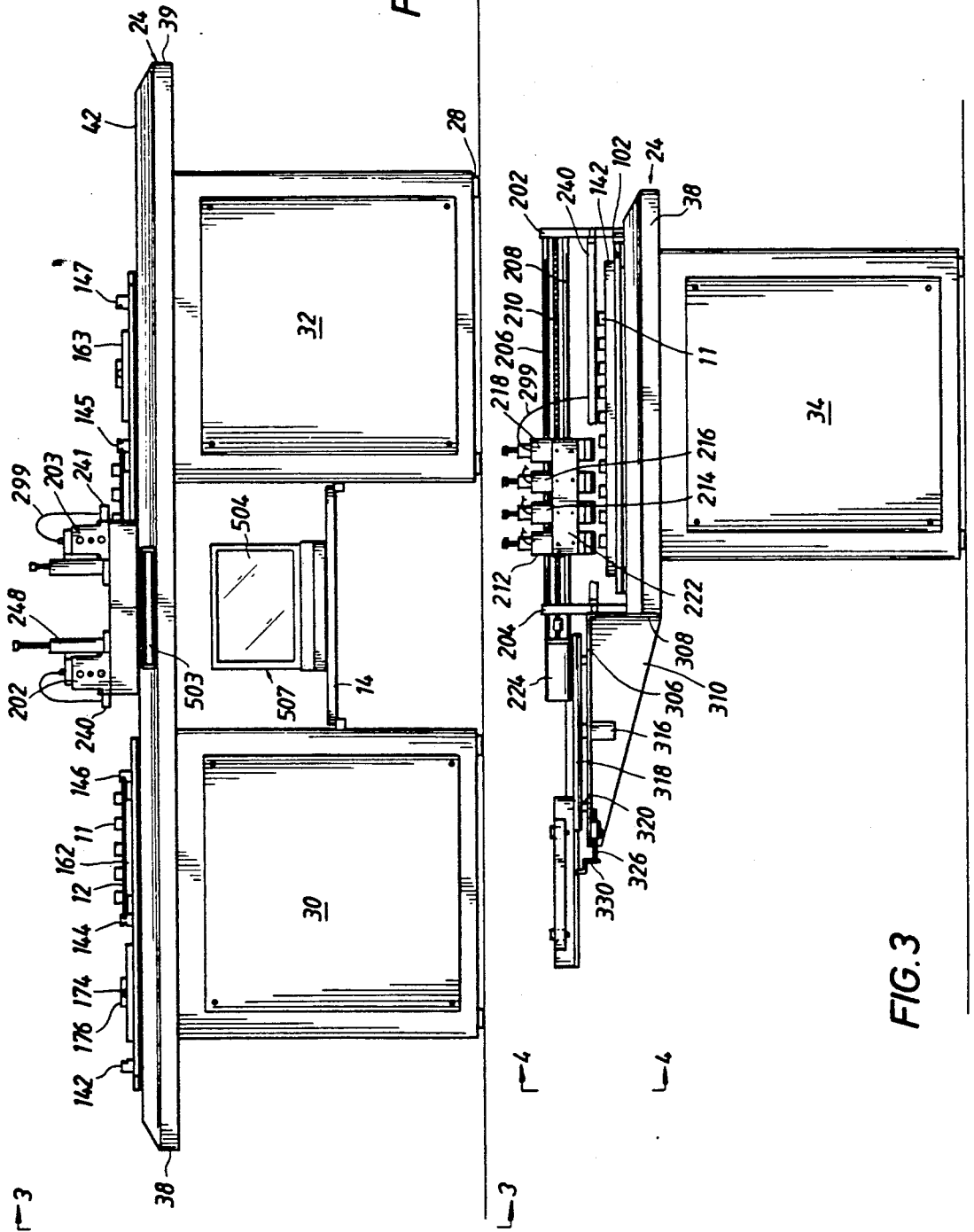
FIG. 2 shows a front elevational view of the loader-/unloader apparatus depicted in FIG. 1.
FIG. 3 shows a side elevational view of the loader-/unloader apparatus along the line 3—3 in FIG. 2.

Referring to FIGS. 2 and 3, the support structure 20 of loader/unloader apparatus 10 includes a bilateral support base indicated generally by reference numerals 22 and 23 and a support platform indicated generally by reference numeral 24. Each of support bases 22 and 23 is generally comprised of a framework 26 supported on feet 28 and enclosed by sheet metal panels affixed at the front, back, sides and bottom. FIG. 2. shows left front panel 30 and right front panel 32, and FIG. 3 shows left side panel 34. The closures of framework 26 by the front, back, side and bottom panels provide left and right cabinets in the support base. These cabinets house the various logic controllers, relays, pneumatic and vacuum pressure valving and sensors, and other systems as hereinafter described. Rigidly connected to support bases 22, 23 is support platform 24. Support platform 24 includes frame work 36, left and right end panels 38 and 39, front panel 42, bottom panel 44, and top panel 46, all fastened suitably by welding or bolting to form a rigid enclosure. Top panel 46 contains four lateral slots, namely, front slot 48, intermediate slots 50 and 51, and rear slot 52. Through these slots pass supports to left carrier plate 101 and right carrier plate 102 as more particularly described below.

Burn-in-Board/Tray Carrier System

Referring now particularly to FIGS. 15, 16 and 17 in conjunction with FIGS. 1, 2 and 3, the drive systems of burn-in board or tray carrier systems 100A and 100B are described. Referring first to FIG. 16, left rear, rear X-axis shaft support mount 104 and right rear, rear X-axis shaft support mount 105 are rigidly affixed, respectively, to left and right end panels 38 and 39, and to bottom panel 44, and supportingly mount rear X-axis support shaft. 60. Similarly, left front, front X-axis shaft support mount 106 and a right front, front X-axis shaft support mount (not shown) supportingly mount front X-axis support shaft 61. Referring to FIG. 15, right carrier plate 103 is slidingly mounted on front X-axis support shaft 61 by right carrier plate left front bearing mount 109 and by right front bearing mount 111, and is slidingly mounted on rear X-axis support shaft 110 by left rear bearing mount 113 and right rear bearing mount 115. Bearing mounts 109 and 111 pass through slot 48 of top panel 46, and bearing mounts 113 and 115 pass through slot 52. Similarly, front left and right bearing mounts 108 and 110 slidingly mount left carrier plate 102 on front X-axis shaft 61, and left and right rear bearing mounts 112 and 114 slidingly mount carrier plate 102 on rear X-axis support shaft 60. Front and rear X-axis shafts 61 and 60 provide a track on which carrier plates 102 and 103 may travel laterally left-to-right or right-to-left in an X-axis movement.

Positioning of right carriage plate 103 is controlled by right carrier plate drive motor 117, the shaft of which is coupled by flexible coupling 119 to rear X-axis ball screw shaft 121 which is supported by left rear screw shaft support bearing 123 and by right rear screw shaft support bearing 125. Rear ball nut 127 is threadingly engaged with rear X-axis ball screw shaft 121 and is affixed to ball nut mount 129 which in turn attaches to right carrier plate 103, passing through rear intermediate slot 50 in top panel 46. Similarly, positioning of left carrier plate 102 is controlled by left carrier plate drive motor 116, the shaft of which is coupled by flexible coupling 118 to front X-axis ball screw shaft 120 mounted on left and right front screw shaft support bearing mounts 122 and 124, respectively. Front X-axis ball screw shaft 120 threadingly engages ball nut 126 affixed to ball nut mount 128 attached to carrier 102.

Right carrier plate 103 is provided linear X-axis movement by drive motor 117 as ball nut 127 attached by mount 129 to right carrier plate 103 rides the screw flight of ball screw shaft 121 according to the clockwise or counter-clockwise direction of rotation imparted to shaft 121 by motor 117. Similarly, left carrier plate 102 is given precise linear X-axis placement by clockwise or counter-clockwise rotation imparted by drive motor 116 to ball screw shaft 120 acting on ball nut 126. Drive motors 116 and 117 are brushless direct current servo motors, whose direction of rotation is reversible and whose degree and rat of rotation is accurately controlled according to step pulses generated by the system controller. The motors include an integral position resolver which is coupled electrically to the controller to provide positive feed back for position control. A suitable such drive motor is Compumotor model 57-120 available from Parker Hannisin Corporation, Compumotor Division, 5500 Businesspark Drive, Rohnert Park, Calif. 94928. Suitably the ball screws may have a precision ground $\frac{3}{4}$ inch diameter with a $\frac{1}{2}$ inch pitch.

Affixed to bottom panel 40 by mounts 131 and 133 are optoelectronic position sensors 135, 137 and 139, each having a channel formed in their upper surface for accepting passage therethrough of a downwardly extending indicator flag 141 which is rigidly attached to bearing mount 129 of carrier 103. One upright of the channel supports the light emitter and the other the light detector. When flag 141 passes through the channel of one of the sensors 135, 137 and 139 as carrier 103 moves along an X-axis imposed by support shafts 60 and 61, the flag interrupts the light across the channel from the emitter to the detector of the photosensor and this interrupt triggers a signal for carrier 103. Sensor 135 indicates a limit of travel of carrier of 103 to the left, and sensor 137 indicates a limit of travel of carrier 103 to the right. Sensor 139 indicates a home position. Placement of sensor 139 is arbitrary, so long as it is between limit sensors 135, 137. When placement of sensor 139 is fixed, a signal of limit sensor 135 corresponds to a number of rotations of ball screw shaft 121 in one direction (counter-clockwise from home), and a signal of limit sensor 137 corresponds to a number of rotations of ball screw shaft 121 in the other direction (clockwise from home). Thus, positions along the X-axis of the support shafts for carrier 103 are a specific increment from home position.

A suitable optoelectronic sensor for use as limit sensors 135, 137 and home sensor 139 is slotted optical switch type OPB88OT55 supplied by the Optoelectrical Division of TRW, Inc., 1207 Tappen Drive, Carrollton, Tex. 75008.

Burn-in board or tray carrier systems 100A and 100B include means for supporting, locating and securing the burn-in boards or trays they carry. Referring to FIGS. 1 and 2, carrier plate 102 of carrier system 100A includes guide rail pairs 142, 144 and 146. Guide rails 142 and 146 have U-shaped slots that face guide rail 144. Guide rail 144 is H-shaped, with opposed slots respectively facing guide rail 142 and guide rail 146. Guide rails 143 and 146 are spring loaded. These facing slots of the guide rail pairs slidingly accept a burn-in board 12.

Board 12 is inserted in the opposing slots of guide rails 144, 146 from the front of apparatus 10 (in the guide rail orientations illustrated) and pushed in the slots in a front-to-back movement until board 12 reaches an adjustable stop which comprises a threaded member having stop head 174 threaded into cross member 176. When board 12 is inserted in the opposing slots of guide rails 144, 146 and pushed in the slots back to stop head 174, the coil springs (not shown) in guide rail 146 are compressed an react by exerting a lateral force on board 12, so when board 12 is advanced to stop head 174, the board is held fast on carrier plate 102.

Provision is made in carrier system 100A and 100B to support the underside of burn-in board 12 which is to be located and secured on carrier plates 102 and 103. In the embodiment depicted, use of guide rails to locate and secure the burn-in boards raises the burn-in board off the surface of the carrier plates 102 and 103, and supports are provided to support the burn-in boards from beneath to reduce board flexing when devices are loaded into or unloaded from the sockets 11 on the top surface of the boards. The provision of this support is best viewed in FIG. 1 taken in conjunction with FIGS. 14B and 14C. Referring to FIG. 1, a plurality of recesses 154 and 156 are provided in carrier plate 102 between guide rails 142, 144, and similarly, but not seen, between guide rails 144, 146; in carrier plate 103, similar recesses are provided between guide rails 143, 145 (not visible in FIG. 1), and at reference numerals 159, 161 between guide rails 145, 147. In FIGS. 14B and 14C, reference numeral 159 indicates a recess between guide rails 145, 147. Using the same reference numerals to indicate burn-in board support structure visible in FIG. 1 which is identical to the burn-in board support structure seen in FIGS. 14B and 14C, elongated support bar 163 has pivot pins 165, 167 longitudinally affixed centrally at its base. Pins 165, 167 are received in pivot holes (not shown) in the lateral margins of recess 159. As seen in FIG. 14C, a leaf spring 169 is situated between the front and rear margins of recess 159 in relaxed engagement with the base of support bar 163. The dimension between the rotational axis of pins 165, 167 and the nose 171 of bar 163 is selected such that in the relaxed position of spring 169 nose 171 of bar 163 supports the underside of burn-in board 12. An X-axis displacement of nose 171 of support bar 163 (as illustrated in FIG. 14B) pivots bar 163 about the rotational axis of pins 165, 167, pressing the downwardly rotated edge of the base against spring 169 and deforming spring 169 from its relaxed position. When burn-in board 12 is inserted in the facing channel of guide rails 145, 147 and slid into position, bar 163 is pivoted out of its upright position by board stiffeners which depend from the leading edge of the burn-in board and come into contact with bar 163. When the board stiffeners are moved past contact with support bar 163, the work stored by deformation in spring 169 by deformation urges bar 163 back into its upright position so that nose 171 of bar 163 then supports the underside of burn-in board 12.

Pick and Place Load/Unload Plant Head System

As may be seen by reference to FIG. 3 taken with FIGS. 1 and 2, load/unload plant head system 200A and 200B is surmounted on platform 24 (for clarity only 200A is depicted in FIG. 3). Referring to load/unload plant head system 200A (like structure in load/unload plant head system 200B has one higher integer odd number, by the convention stated above), front mount 202 and rear mount 204 are secured, respectively at the front and rear of platform 24. Each supports an upper Y-axis support shaft 206 and a lower Y-axis support shaft 208. Journaled in front and rear mounts 202 and 204 between shafts 206 and 208 is Y-axis ball screw shaft 210. Referring to FIG. 1 in conjunction with FIG. 2, plant head bearing blocks 212, 214, 216 and 218 are slidingly mounted on support shafts 206 and 208. Bearing block 212 incorporates a ball nut 220 which is threadingly engaged on ball screw shaft 210. Bearing blocks 212, 214, 216 and 218 are united in a fixed spatial relationship by alignment plate 222. Alignment plate 222 is tailored for the dimensions of each particular burn-in board to space the plant heads correctly apart to fit the X-axis rows on the particular burn-in board 12. A set of bearing blocks 212, 214, 216 and 218 each mounting a plant head and coupled by alignment plate 222 is a plant head unit.

A brushless direct current servo drive motor 224 is supported by upper motor mounts 226a, 226b and lower mounts 228a, 228b onto load/unload plant head system rear mount 204. A flexible coupling 230 connects the shaft of drive motor 224 to ball screw shaft 210. Like drive motors 116 and 117, the shaft rotation of drive motors 224 and 225 is reversible and the degree and rate of rotation is precisely controllable by pulses to the motor generated by the system controller 500. As with drive motors 116 and 117, the precise clockwise or counter-clockwise shaft rotation control of drive motors 224 and 225 is translated by ball screw shafts 210 and 211, respectively, and ball nuts 220 and 221, respectively, into precise linear placement of the plant head units on the plant head bearing block mounts along the Y-axis shafts (block mounts 212, 214, 216 and 218 along Y-axis shafts 206 and 208 for motor 224 in plant head system 200A; block mounts 213, 215, 217 and 219 along Y-axis shafts 207 and 209 for motor 225 in plant head system 200B).

Load/unload plant head system 200A, also like carrier system 100A, makes use of optoelectic limit sensors 232a, 232b and home sensor 234 spaced apart on and supported by raceway 240 (the same optoelectric sensor as used for sensors 135, 137 and 139 is suitable). As with the optoelectronic sensors used in the X-axis for the carrier plate 103, the limit sensors 232a, 232b are triggered by an interrupt flag (flag 236 on bearing block 212) and signal a limit of excursion of the plant head on the Y-axis of support shafts 206, 208 over platform 24. The home sensor 234 is also triggered by flag 236 and is positioned between the limit sensors. All positions along the Y-axis of ball screw shaft 210 are a specific increment from the home position of the plant head unit on ball screw shaft 210.

Accordingly, from the above and foregoing description, based on the X-Y grid system imposed by X-axis travel for the carrier plates and Y-axis travel imposed for the pick and plant head system, any burn-in board of known rows and columns and socket spacing has a socket location defined as some incremental distance left or right from the X-axis home position of the carrier plate and some incremental distance in front of or behind the Y-axis home position of the plant head unit. With the X-axis and Y-axis home references set, system controller 500 calculates these incremental distances.

Plant head bearing block mounts 212-219 are internally configured with vacuum and air pressure passageways. Flexible tubing air and vacuum lines are connected with the vacuum and air passageways of each of these block mounts. The vacuum and air pressure tubing lines run to the block bearings mounts from horizontal raceways 240, 241, which they enter from the base cabinetry where the vacuum and air pressure control systems are situated. (The drawings do not illustrate the many vacuum and air pressure lines or electronic cablings employed in apparatus 10.) The vacuum and air pressure tubing from raceways 240, 241 are representatively indicated by the general reference numeral 299 in the drawings.

Referring now to FIGS. 10, 11, 12 and 13, a representative plant head 244 is depicted. In the description of this representative plant head assembly, the convention adopted above does not apply, that is, an odd number is not a like member to a next lower integer even number.

Plant head 244 comprises an air cylinder assembly 245, a mounting plate 246 and a socket opener assembly 247. Air cylinder assembly 245 includes air cylinder 248 attached by mounting bolt (not shown) to mounting plate 246. Air cylinder 248 is upwardly closed by cylinder plug 249 affixedly secured to cylinder 248 (by means not shown). Cylinder 248 and cylinder plug 249 have central openings through which pass a tubular piston rod 250 which contains a central conduit 251 along its axial length. Rod 250 fixedly mounts double acting piston 251 within chamber 252 (upper chamber portion 251a; lower chamber portion 252b) of cylinder 248. Air pressure in air cylinder 248 is sealed by O-rings 253, 254a, 254b and 255.

The lower extremity of piston rod 250 terminates in a threaded portion (not seen) on to which nut 256 and tubular pad assembly 257 are threadingly attached. Pad assembly 257 comprises both a first tubular member 258 having an upper nut portion 258a and a lower shaft portion 258b, and a second tubular member 259 supporting a vacuum pad portion 260. Upper nut member 258a is internally threaded to threadingly engage the externally threaded end of piston rod 250. Lower tubular member 258b is internally threaded to accept external threads on the tubular shaft of vacuum pad support member 259. The bore 261 of tubular pad assembly 257 is continuous with axial conduit 251 of rod 250. Also fitted on a portion of piston rod 250 extending below air cylinder 248 above the end of rod 250 is an adjustable stop 262 for precise limitation of the extent of retraction of rod 250 into air cylinder 248. Nut 256 acting with the nut structure of upper portion 258a permits pad assembly 257 to be adjusted and secured longitudinally along the exteriorly threaded end of piston rod 250 to a position which places vacuum pad member 260 a precise distance above sockets 11 on burn-in board 12.

Mounting plate 246 to which representative air cylinder assembly 245 attaches is in turn attached to the bearing blocks 212-219, bearing block 218 being identified merely as an exemplar in FIGS. 10 and 12. Mounting plate 246 is provided with internal vacuum and air pressure passageways which connect with internal passageways in the bearing blocks, for example, bearing block 218. An internal vacuum passageway (not shown) from bearing block 218 to mounting plate 246 connects at the top face of mounting plate 246 through nipple fitting 263 with flexible tubing 264, which connects through fitting 265 to conduit 251 of piston rod 250 and by conduit 251 to bore 261 of pad assembly 257 for application o vacuum pressure at the undersurface of vacuum pad 260.

Another internal passageway (also not illustrated) from bearing block 218 through mounting plate 246 is connected by fitting 266 to tubing 267 connected by nipple screw fitting 268 to upper chamber portion 252a to provide a continuous passageway for air pressure from a source (not shown) through the passageway of block 218 through mounting plate 246 into upper chamber portion 252a against the upper face of piston 251, thereby to cause piston rod 250 to extend from air cylinder 248. Another passageway, indicated at reference numeral 269, introduces air from a source through bearing block 218, mounting plate 246, and air cylinder 248, into lower chamber portion 252b against the lower face of piston 251, thereby to cause piston rod 250 to retract into air cylinder 248 to the extent permitted by stop 262.

In its lower extremity, bearing block 218 and mounting plate 242 have aligned air passageways that interconnect (sealed by O-rings 270a, 270b) to admit air through conduit 271 into horseshoe conduit 272 of socket opener 247, which is attached to the lower portion of mounting plate 246 by recessed machine screws (not shown).

Referring to FIG. 10 taken with FIG. 12, socket opener 247 is seen to be rectangular in shape with a central rectangular aperture 273 through which, in FIG. 12, the interior face of vacuum pad 260 and the vacuum passageway 261 are visible. Socket opener 247 includes an upper socket opener mount 274. Horseshoe conduit 272 resides in socket opener mount 274 and opens into four corner bores 275, 276, 277 and 278 which open to the bottom of mount 274. The two outer corner bores 277, 278 are illustrated in cross section in FIGS. 11 and 13. Fitted into bores 273-276 are four pistons, of which two pistons 279 and 280 are visible in FIGS. 11 and 13. The base of each piston is internally threaded to accept a screw. Screws 281, 282, 283 and 284 secure socket opener plate 285 to the bases of these pistons, including illustrated screws 283 and 284, respectively, to pistons 279 and 280. O-rings 286a–d seal the positive pressure imparted from horseshoe conduit 272 to the crown of these pistons within bores 275-278. Midway between the outer corner bores 277, 278 are coaxial first and second bores 287, 288. Midway between inner corner bores 275, 276 are coaxial first and second bores 289, 290. The coaxial second bores 288, 290 open to the bottom surface of socket opener mount 285; the coaxial first bores 287, 289 are of larger diameter and open to the top surface of socket opener mount 285. Coil springs 291, 292 fit respectively in bores 287, 289 under compression against the slotted heads 293a, 294a of retaining rods 293, 294, which contain springs 291, 292 within bores 287, 289. The lower extremities 293b, 294b of rods 293, 294 are of diameter to pass through second bores 288, 290, are axially bottom tapped and internally threaded, and are bottom fastened to socket opener plate 285 by screws 295, 296 passed through drilled holes in plate 285. With this structure, air pressure admitted into bores 275-278 forces the pistons in the bores downwardly in a Y-axis direction, extending socket plate 285 from socket opener mount 274 a Y-axis distance determined by the length of the lower extent of retaining rods 293, 294 and the height of second bores 288, 290. The downward extension further compresses coil springs 291, 292 between the slotted heads of rods 293, 294 and the base of first bores 287, 289. When air pressure on the pistons in the corner bores 275-278 is removed, energy stored in compressed springs 291, 292 is exerted against the heads of rods 293, 294, retracting plate 285 home to bear against the bottom surface of socket opener mount 274 under the force of the still partially compressed springs.

Although the plant head loader/unloader has been described for a particular embodiment in which the device holder is a vacuum head, other configurations may be employed for the device holder depending on the device to be loaded or unloaded from the particular kind of socket. The architecture of the plant head permits quick replacement of one kind of device holder with another.

Tube Transport System

IC devices are received from the device manufacturers in elongated plastic tubes of substantially rectangular cross section or in trays. As respects the tubes, conventionally the devices are placed in the tubes in a specific orientation so that the location of pin one is known when the device exits the tube. Referring to FIGS. 1, 4, 5, and 6 elongated tubes for IC devices are shown in outline and are indicated by reference numerals 1–8. Reference numerals 300A and 300B generally indicate dual tube transport systems for feeding device containing tubes to the dual device staging systems, indicated generally by reference numerals 400A and 400B.

A framework including lateral frame members 302, 303 and medial frame members 304, 305 extends from platform 24. Sheet metal panels cover the framework at the top, back, and medial sides. Referring to tube transport system 300A (like structure in tube transport 300B has one higher integer odd number, by the convention stated above). The panels include top panel 306, back panel 308 and medial side panel 310 (see especially FIGS. 1 and 3). Top panel 307, back panel 309 and medial side panel 311 of tube transport system SOOB are best viewed in FIG. 4. Slots 312, 313 are respectively provided at the X-axis midline of top panels 306, 307.

Mounted between lateral and medial frame members 302 and 304 of tube transport system 300A is an X-axis rodless air cylinder shaft 314. A magnetic dual acting air piston (not shown, but see comparable structure 439 in FIG. 8) is provided for X-axis movement in air cylinder 314. Air pressure tubing (not shown) passes air into one or the other of fittings (not shown) at the opposite extremities of rodless air cylinder shaft 314 according to air valving regulated by system controller 500. This air is impressed upon one of the two heads of the piston in fluid communication with the fitting to force the piston through the cylinder in a selected x-axis direction. Slidingly circumferentially mounted upon air cylinder shaft 314 is a magnetic slide block 316 of polarity opposite to the magnetic polarity of the piston within air cylinder shaft 314 (as maybe best viewed in FIGS. 3 and 4). Movement of the piston within air cylinder shaft 314 also moves sliding block 316 under the influence of the magnetic attraction between the piston and sliding block 316. Attached to sliding block 316 is drive plate 318 which medially has a Y-axis face perpendicular to the X-axis of air cylinder shaft 314. Thus, under the direction of the system controller valving air into air cylinder shaft 314, drive plate 318 is moved along the X-axis of air cylinder 314 according to system instruction. Mounted on top panel 306, below the bottom of drive plate 318, are a plurality of X-axis rails 320, 322 and 324. Fastened to top panel 306 by end mounts 326, 328 is end flange 330. Cover 332 is mounted above rail 324. An adjustable stop 334 is provided near the medial extremity of air cylinder shaft 314 to limit the medial X-axis extent of travel of slide block 316 and thereby limit the medial X-axis travel of drive plate 318.

In operation, a plurality of tubes containing IC devices are placed on the tube transport rails. For example, as in FIG. 1, for tube transport system 300A, the tubes are placed on rails 320, 322, 324 and flange 330. The system controller valves air into air cylinder 314 and forces the air piston in it toward frame member 304. The leading edge of drive plate 318 contacts the trailing edges of the device container tube most remote from device staging system 400A (for example, tube 8 in FIG. 1) and pushes it into Y-axis alignment parallel to the Y-axis medial face of drive plate 318 until all the tubes are aligned parallel to the Y-axis medial face of the drive plate, as illustrated for system 300B in FIGS. 1, 4, 5 and 6. When wafer switch 473 described below is closed, controller 500 is signaled and valves air to rodless cylinder 314 (315) to cease its medial movement towards frame member 304 (305).

Device Staging System

Referring to FIG. 1, device staging systems 400A and 400B are now described. As most advantageously viewed in FIG. 1, device staging systems 400A and 400B are disposed in a Y-axis, which is perpendicular to the X-axis of air cylinders 314, 315 of tube transport systems 300A and 300B, between which device staging systems 400A and 400B are positioned, and parallel to the Y-axis of ball screw shafts 210 and 211 of load/unload plant head systems 200A and 200B.

Figure 4:
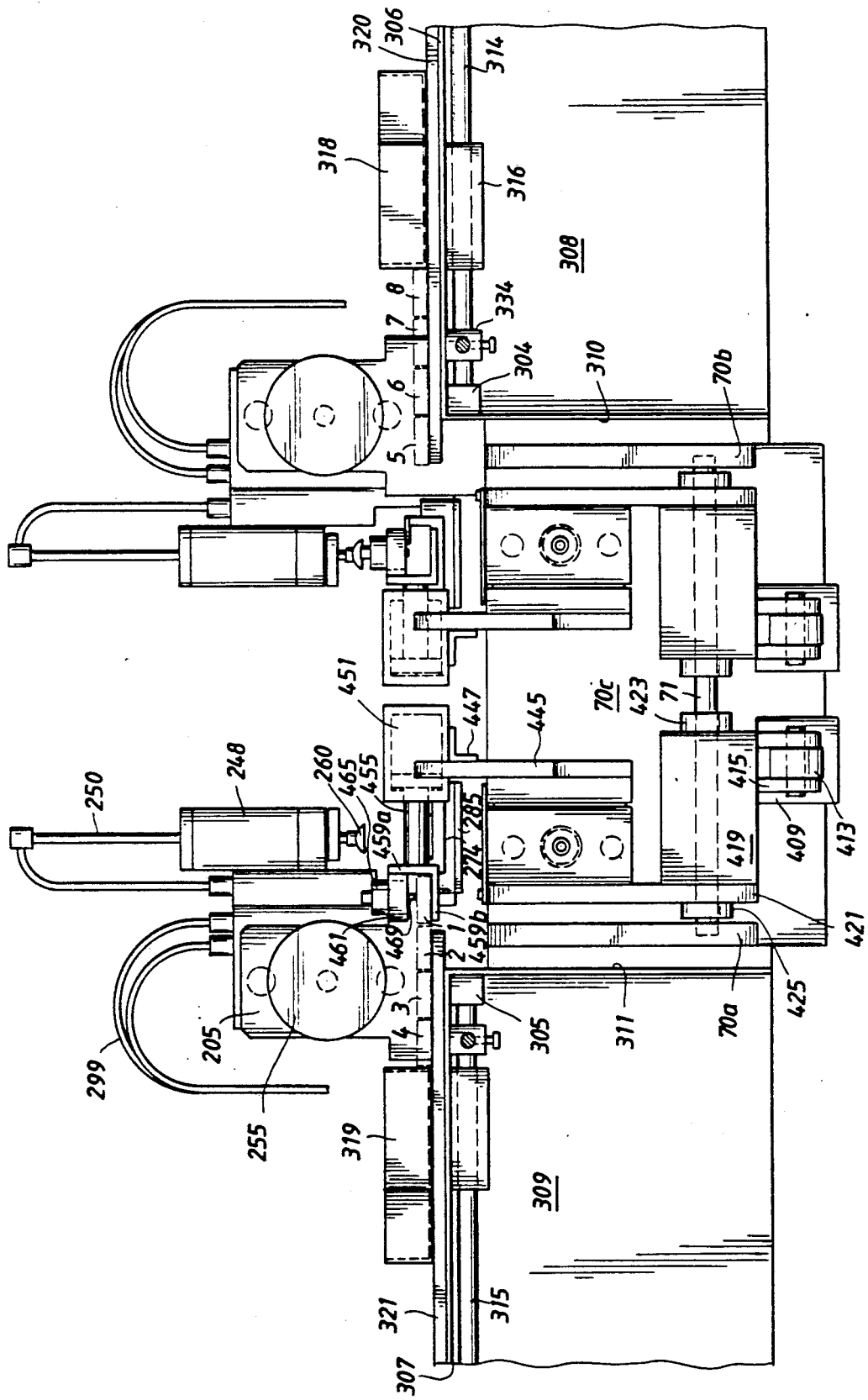
FIG. 4 shows a partial rear view particularly of the load/unload plant head systems, tube transport systems, and device staging systems along the line 4—4 in FIG. 3.
Figure 5:
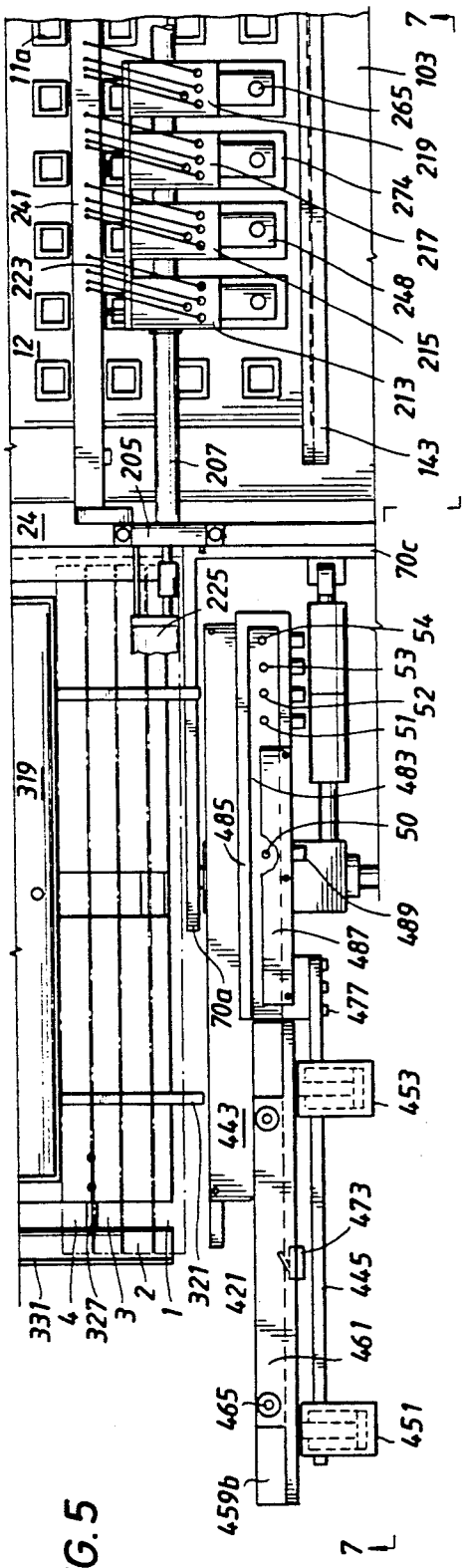
FIG. 5 shows a partial overhead plan view along the line 5—5 of FIG. 2, with portions removed to disclose pertinent portions of the apparatus, and particularly shows the device staging portions of the apparatus in pivot ready position.

Referring to FIGS. 7 and 8 taken in conjunction with FIG. 4, device staging system 400B (like structure in device staging system 400A has one lower even number integer, by the convention stated above) is supported by U-shape bracket mount 70 affixed to the rear medial portion of platform 24. Mount 70 includes two arms 70a, 70b which project rearwardly from base plate 70c of mount 70. Affixed to the medial lower portions of the base 70c of mount 70 are female clevis flanges 401 which mount the front male clevis member 403 of piston rod 405 of siamesed air cylinder units 407, 409. Extending from siamesed unit 409 is piston rod 411 terminated in a male clevis 413, which pivotally attaches to female clevis member 415 by pivot pin 417. Female clevis member 415 depends from pivot block 419 which is laterally affixed to pivot plate 421. A main pivot pin 71 is journaled in support mount arms 70a and 70b. Pivot block 419 and affixed pivot plate 421 are supported on pivot pin 71 at bearings 423, 425.

Referring to FIGS. 7 and 8, front shuttle shaft mount 429 is affixed at the leading edge in an upper portion of pivot plate 421 and rear shuttle shaft mount 431 is affixed at the same elevation in the upper rear portion of plate 421. Supported by and between front and rear shuttle shaft mounts 429 and 431 are upper cylindrical support shaft 433 and lower cylindrical shuttle support shaft 435. Supported by mounts 429, 431 between support shafts 433 and 435 is rodless air cylinder 437. Inside rodless air cylinder 437, as illustrated in FIG. 8, is magnetic double acting air piston 439. Supported on support shafts 433 and 435 is magnetic slider block 441, which has opposite polarity to the magnetic poles of piston magnet 439. Fastened to the tops of support mounts 429, 431 and spanning the distance between them is cover panel 443.

Fastened to magnetic slider block 441 is shuttle plate 445, which has affixed to it medial flange supports 447, 449. Medial flange supports 447, 449 fixedly support air cylinders 451, 453. Air cylinders 451, 453 are horizontally disposed in the X-axis with their piston rods 455, 457, respectively, extendable laterally in an X-axis direction toward tube transport system 300B. Affixed to the tail of piston rods 455, 457 is the vertical member 459a of L-shaped tube carrier 459. The horizontal shelf member 459b of tube carrier 459 is horizontally level with rails 331, 321, 323 and 325 of tube transport system 300b, as best viewed in FIG. 4 (321 visible). Affixed at the top portion of vertical member 459a is a canopy member 461 which covers the central portion of tube carrier shelf 459b substantially between air cylinders 451 and 453. Surmounted on canopy 461 over apertures (not shown) are air cylinders 465, 467 that, when valved with air, extend adjustable shaft piston rods 469, 471 downwardly a predetermined extent calibrated to define a gap between the floor of shelf 459 and the end of pins 469, 471 equal to the height of device tubes 1–8. A wafer switch 473 is mounted in a normally open position on tube carrier vertical member 459a near the junction with tube carrier shelf member 459b. Receipt of a tube upon tube carrier shelf 459b flush against vertical member 459a depresses switch 473, closing it and signaling system controller 500, which valves air to air cylinders 465, 467 causing them to extend piston rods 469, 471 and engage tube 1 pressing tube 1 against shelf 459b.

Referring to FIGS. 5–8, shuttle plate 445 at its forward end mounts device slideway 475 with fasteners 477, 479 and 481. Slideway 475 comprises a center channel 483 and a rim of slightly higher elevation, 485. A slideway canopy 487 is provided over the rear and central portions of slideway 485. Slideway 485 contains internal separate vacuum passageways which individually communicate, respectively, with vacuum tubing fittings 489, 491, 493, 495, and 497. The internal passageways in device slideway 475 open into ports $S_0$, $S_1$, $S_2$, $S_3$ and $S_4$ in the floor of channel 483 of device track 485. The ports are spaced apart a predetermined distance equal to center to center distances between touching devices as they are oriented longitudinally in tubes 1–8. The spacing between port $S_0$ and $S_1$ suitably is equal to the spacing between ports $S_1$ and $S_2$ multiplied by the number of ports except port $S_0$; in this embodiment, the multiple therefore is four.

As it will have now been appreciated, the burn-in loader/unloader apparatus of this invention is comprised of two independent load/unload work stations. Each station comprises a burn-in board carrier system, a tube transport system, a load/unload pick and place plant head system, and a device staging system. Each station may operate independently using different device types or boards for maximum flexibility, or may be used jointly with the other station on a single device type and board to provide true continuous operation and maximize through-put. When used jointly, one carrier is positioned under the load heads, and the other is accessible to the operator for board or tray exchange.

For highest speed operation with joint use of the two independent stations, devices equal in number to the number of plant heads of each station can be loaded or unloaded to and from the burn-in board simultaneously by each station. In this parallel mode of operation, all load heads of a station insert or extract devices to or from the burn-in board at the same time. The alignment plates 222, 223 of the load/unload plant head system space the load heads 240 correctly to fit the columns or rows on the board. Alignment plates 222, 223 are attached to mounting blocks 212 by four quick detach screws. Mounting plate 242 for plant head assembly 240 is attached to mounting block 212 by two quick detach screws so a specific plant head assembly 240 for the particular socket 12 size and appropriate vacuum pad assembly 257 or other means at the end of rod 250 for releasably attaching an IC device can be quickly substituted. Slideway 475 is quickly exchangeable by fasteners 477, 479 and 481 for another slideway whose spacing for ports $S_0$, $S_1$, $S_2$, $S_3$ and $S_4$ and channel width 483 is particular to another device size. All other spacing is controlled by data input through software as more particularly hereinafter described.

Alternatively, the two independent stations may be operated serially to load or unload a burn-in board. Serial operation eliminates the need to change an alignment plate to accurately space a station load heads to match the rows or columns on the burn-in board. The serial loading flexibility of the invention is particularly useful in reducing the risk of damage to burn-in boards by flex of the boards imposed in loading larger high insertion force devices more than one device at a time.

In the serial loading mode, the control system of the automated load/unload apparatus of this invention optimizes the load head path to the nearest socket, minimizing travel time between device insertions or extractions.

Control System

Figure 18:
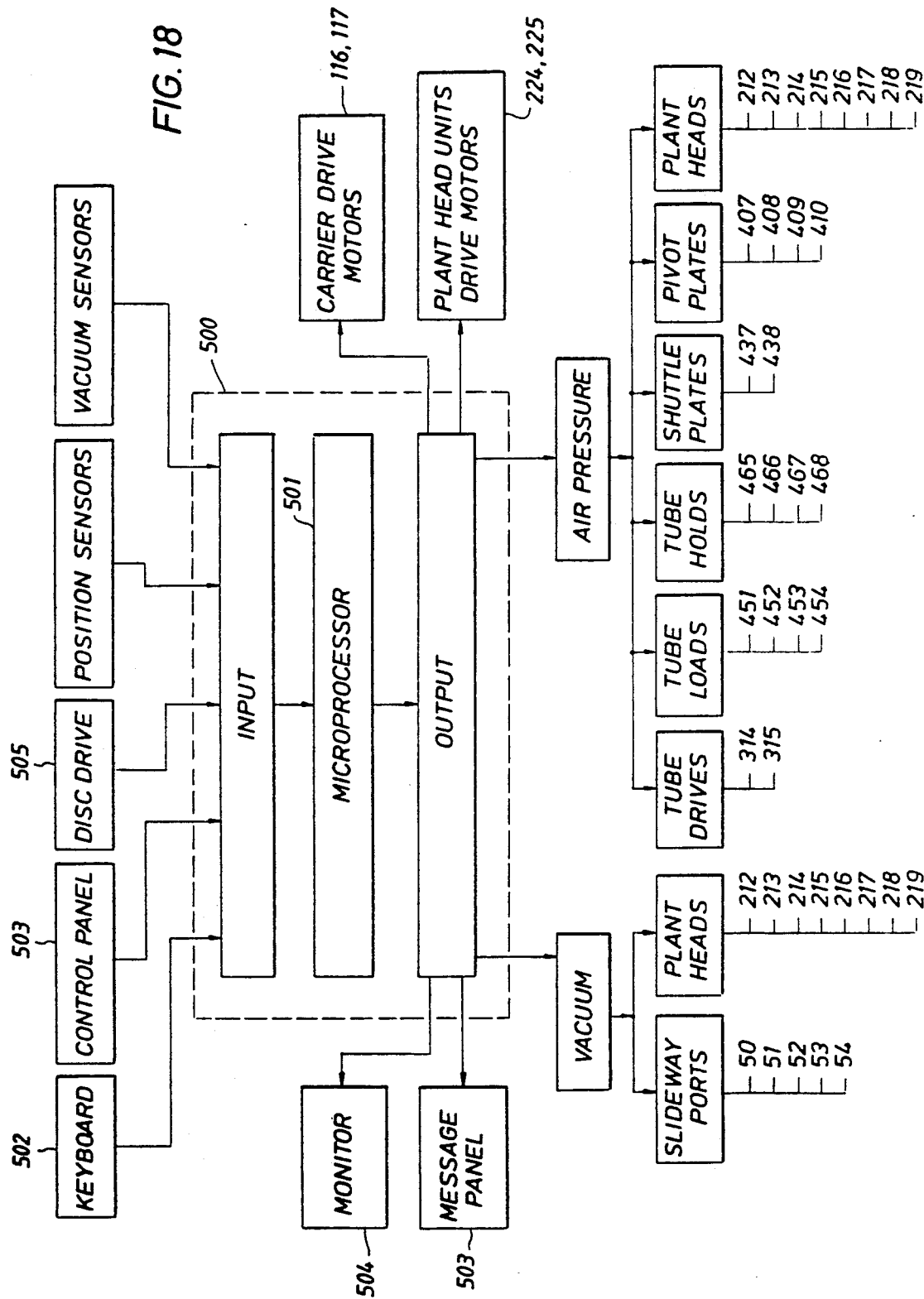
FIG. 18 is a schematic of the control system of the apparatus.

Referring to FIG. 18, a block diagram of the control system 500 is illustrated. In this portion of the description, the convention adopted hereinabove is not used; however, reference numerals employed in the block diagram refer to the same components as hereinabove described. At the heart of the control system 500 is microprocessor 501. The operator commands the microprocessor through keyboard input device 502 and push buttons on control panel 503. Messages are communicated to the operator from the microprocessor by monitor 504 and message lights on control panel 503. Programming instructions and stored data are furnished to microprocessor 501 from written media by read/write disc drive 505. Suitably, microprocessor 501, keyboard 502, monitor 504 and disc drive 505 are contained in a computer 510, shown in FIGS. 1 and 2.

Burn-in board socket spacing is entered manually from keyboard 502 or by leading a load head group from one corner socket of a burn-in board to a corner socket across the diagonal of the burn-in board. A learning routine of system controller 500 automatically calculates intermediate socket spacing using row by column information entered by the keyboard or from data storage for the particular burn-in board. The program routines are capable of identifying sockets on the burn-in board not to be loaded from data of socket locations where there ma be position failure.

Microprocessor 501 provides operating instructions to carrier drive motors 116, 117; to plant head group drive motors 224, 225; and to the air pressure cylinders employed in load/unload plant head systems 200A and 200B, in tube transport systems 300A and 300B, and in device staging systems 400A and 400B. In load/unload plant head systems 200A and 200B, this is to air cylinder 248 of each of plant head mounts 212, 213, 214, 215, 216, 217, 218 and 219. In tube transport systems 300A and 300B, this is to rodless tube drive air cylinders 314 and 315. In device staging systems 400A and 400B, this is to tube load cylinders 451, 453 and 452 and 454; to tube capture cylinders 465, 467 and 466, 468; to shuttle plate rodless cylinders 437 and 438; and to device staging system pivot cylinders 407, 409 and 408, 410.

Microprocessor 501 also controls the vacuum applied to the plant heads for mounts 212, 213, 214, 215, 216, 217, 218 and 219 and to the ports $S_0$, $S_1$, $S_2$, $S_3$ and $S_4$ of slideway 475.

Microprocessor 501 receives input from carrier position sensors 134, 136 and 138 for carrier system 100A and from 135, 137 and 139 for carrier system 100B; from plant head position sensors 232a, 232b and 234 of system 200A and from sensors 233a, 233b and 235 of system 200B; and also receives system inputs from vacuum sensors associated with the vacuum systems for each of ports $S_0$, $S_1$, $S_2$, $S_3$, and $S_4$ and for the vacuum lines 251, 261 of each plant head 244.

BIB Loading Operation from Tube

In the following description of loading a burn-in board, operation in the serial mode is described. In parallel operation, the individual plant heads of a plant head unit move as one when planting or extracting devices in sockets on the burn-in board.

In serial operation, operation of the dual stations of apparatus 10 is ideally 180 degrees out of phase (although it may vary from 0 degrees to 180 degrees out of phase), so that, for example, when station A is loading devices into a burn-in board on carrier 102, station B is operating to stage devices for pick-up. Accordingly, for simplicity, operation will be described in respect to one of the stations, station B.

Figure 6:
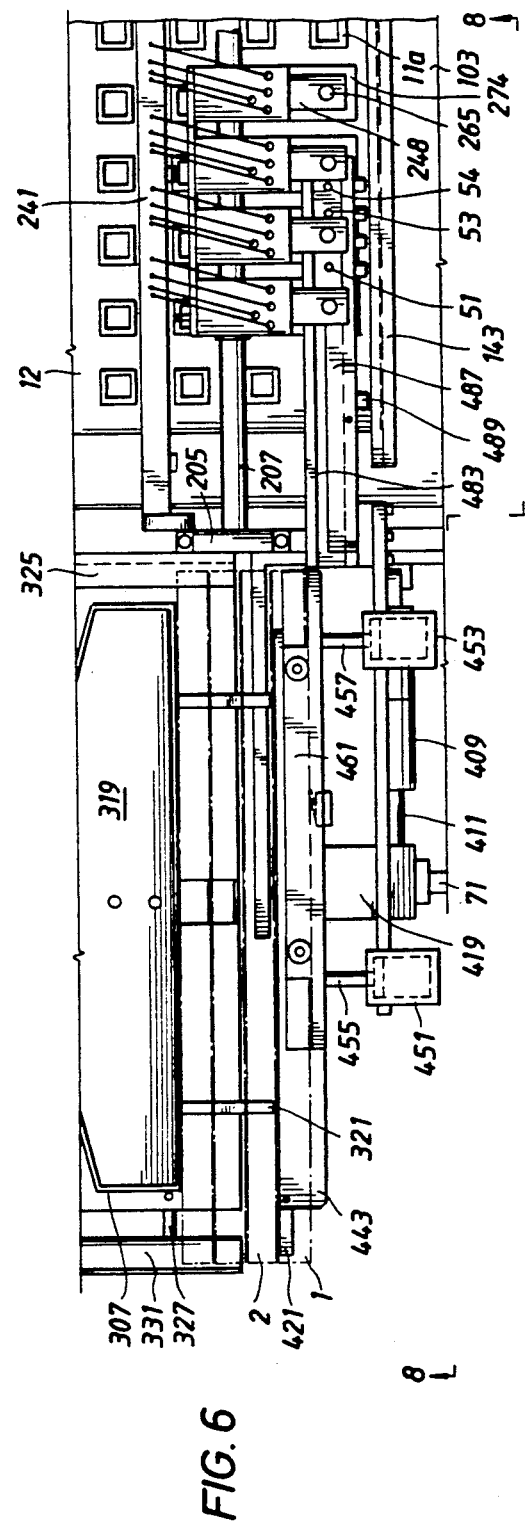
FIG. 6 is the same view as FIG. 5, and shows the device staging apparatus in tube loading position.

In the operation of station B to load devices into the socket 11 of burn-in board 12, first, a tube containing the devices is loaded by tube transport station 300B onto device staging system 400B. Referring to FIG. 6, controller 500 valves air to the portion of air cylinder 437 remote from platform 24, driving piston 439 toward platform 24 thereby carrying with it slider block 441 to which shuttle 445 is fastened, thus extending device slideway 475 into its forward position over platform 24 and positioning tube carrier 459 into loading position. Controller 500 valves air pressure into air cylinders 451, 453 to extend piston rods 455, 457 from the cylinders, advancing tube carrier 459 to loading position when the piston rods are fully extended. Controller 500 then valves air pressure to the lateral fitting for air cylinder 315, thereby driving the piston contained in cylinder 314 medially toward device staging station 400b, slider block 317 moving with the piston and carrying with it drive plate 319, which forces tube 1 forward on guiderails 321, 323 and onto shelf 459b against upright 459a, in the process pressing wafer switch 473, which signals controller 500. Controller 500 valves air to air cylinders 465, 467, moving rod 469 down into contact with the top of tube 1, pressing it against shelf 459b, securing tube 1. Concurrently, controller 500 valves air to rodless tube drive air cylinder 315 to stop the advance of drive plate 319. Controller 500 then valves air to the top of the piston of air cylinders 451, 453, fully retracting piston rods 455, 457 and tube carrier 459. The controller then valves air to rodless shuttle air cylinder 437 to drive shuttle plate 445 away from platform 24 to its retracted position, shown in FIGS. 5 and 7.

Figure 9:
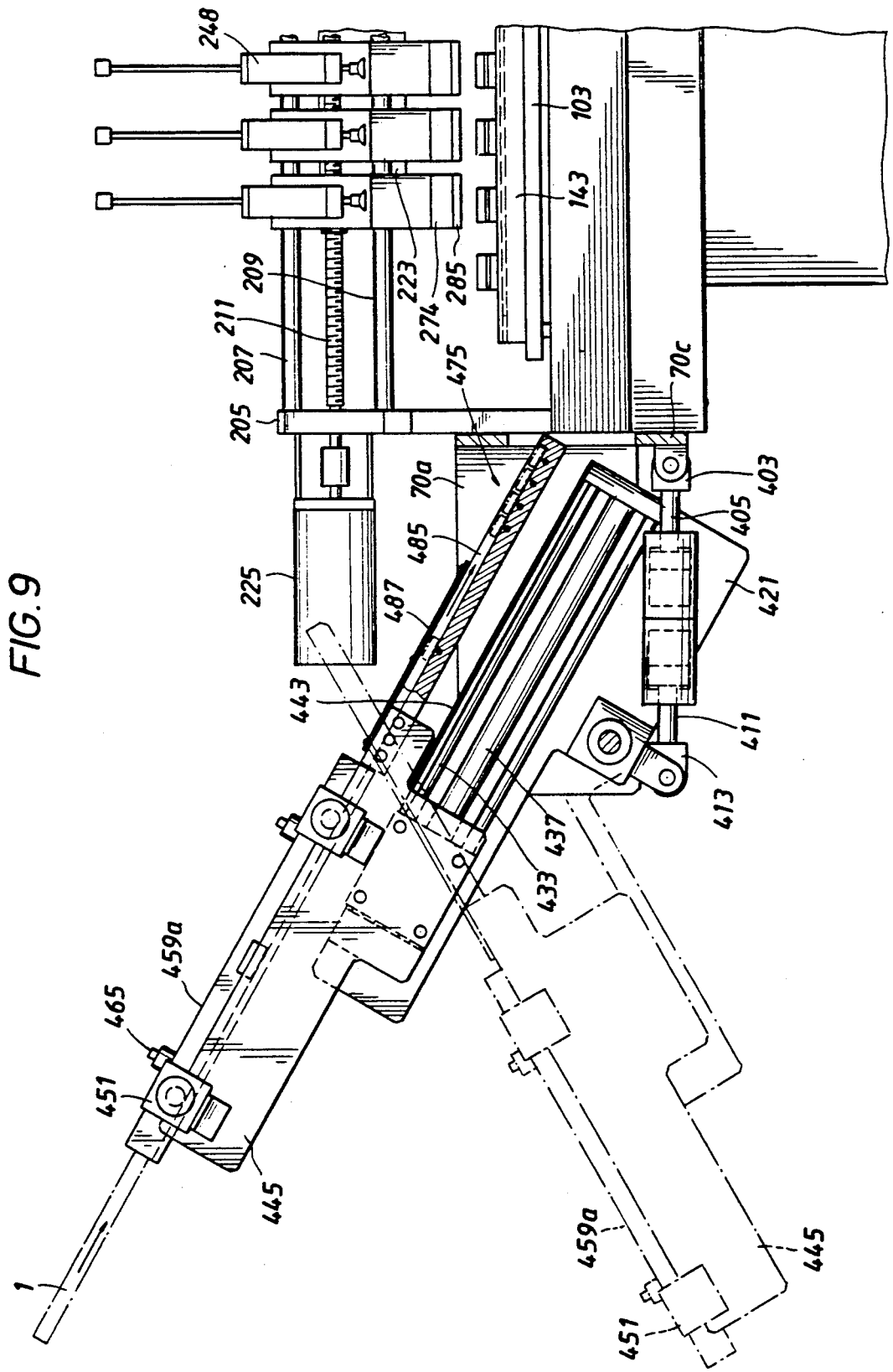
FIG. 9 is a side elevational view comparable to FIG. 7 and FIG. 8, and shows the device staging portion of the apparatus pivoted to stage devices for loading in accordance with the invention, and conversely in shadow, to illustrate the device staging apparatus pivoted to a tube unloading position.

With tube 1 loaded onto tube carrier 459, devices in the tube are then moved onto track 475 for pickup by load heads 213, 215, 217, and 219. Referring to FIG. 9, controller 500 valves air to cylinder 407, extending rod 405, which cranks female clevis 415 clockwise (as viewed in FIG. 9), rotating pivot block 419 affixed to pivot plate 425 about bearings 423, 425 on pivot pin 71 journaled in arms 70a, 70b, thereby pivoting pivot plate 421 device staging station 400B to a slideway down position in which the foreward portion of slideway 475 is lower than the rear portion of slideway 475, and slideway 475 is lower than tube carrier 459. The angle of "pivot down" inclination suitably is from about 25 degrees to about 32 degrees, preferably about 28 degrees. The elevation of the surface of shelf 459b is lower than the elevation of the center channel 483 of slideway 475 by a distance equal to the thickness of tube 1, so that the inner floor of the tube is at the same level as the floor of channel 483. Thus when device staging station 400B is rotated to the "pivot down" position illustrated in FIG. 9, devices contained in tube 1 slide from the tube onto and down channel 483 of slideway 475 through the tunnel defined by channel 483, rim 485 and canopy 487.

The slide of devices from tube 1 down slideway 475 is regulated by system controller 500 both to minimize any impact damage to the leads of the devices and to gate the devices into pickup position on the forward portion of slideway 475. The system controller regulates vacuum valving to ports $S_0$, $S_1$, $S_2$, $S_3$, and $S_4$ to turn vacuum pressure at the ports "ON" (vacuum on) or "OFF" (vacuum off).

When the system controller "pivots down" device staging station 400B, it valves port $S_0$ OFF, and ports $S_1$, $S_2$, $S_3$, and $S_4$ ON. The lead device sliding from tube 1 upon pivot down of device staging station 400B is braked and arrested to a stop over one of ports $S_1$, $S_2$, $S_3$ or $S_4$ by vacuum applied at ports $S_1$, $S_2$, $S_3$ and $S_4$. System controller 500 then valves vacuum at port $S_0$ ON, and next valves vacuum at ports $S_1$-$S_4$ OFF. This arrests the device over $S_0$ and all trailing devices in slideway, and permits all devices forward of port $S_0$ to slide down slideway 475 to any next unoccupied position, thus filling the positions over ports $S_1$, $S_2$, $S_3$ and $S_4$ (if there are a sufficient number of devices to do so). System controller 500 then valves ports $S_1$-$S_4$ vacuum ON, and inspects to confirm vacuum at ports $S_1$-$S_4$.

If vacuum is not confirmed at all of the ports $S_1$-$S_4$ (simplying one or more of the ports has no device in place over it for pickup), system controller 500 inspects port $S_0$ for vacuum. If vacuum exists at port $S_0$ (implying a device over port $S_0$ and perhaps a train of devices held behind it), the system controller valves vacuum to port $S_0$ OFF, permitting the device over port S and next trailing devices to slide down slideway 475 for arrest by vacuum still ON at ports $S_1$-$S_4$ at a rear most port where a device is not already arrested. Turning port $S_0$ vacuum ON, system controller then valves ports $S_1$-$S_4$ vacuum OFF, permitting the devices to advance forward to position over any unoccupied port. System controller 500 then valves vacuum ON to ports $S_1$ and $S_4$ and again inspects for vacuum confirmation at ports $S_1$-$S_4$. If vacuum is not confirmed at ports $S_1$-$S_4$, system controller 500 inspects for vacuum at port $S_0$. If vacuum is again confirmed at port $S_0$, yet after the foregoing gating of addition device(s) ports $S_1$-$S_4$ are signaled still not wholly occupied, the implication is a jam is in the slideway; the system controller turns OFF the vacuum to ports $S_0$ and $S_1$-$S_4$, and, valving air from cylinders 407 and 409 to retract piston rods 405 and 411, respectively, cranks female clevis 415 counter-clockwise (as viewed in FIG. 9), rotating pivot block 419 affixed to pivot plate 421 about bearings 423, 425 on pivot pin 71 journaled in arms 70a, 70b, thereby rotating pivot plate 421 and device staging station 400B to the "pivot up" position illustrated in shadow outline in FIG. 9. This permits devices in slideway 475 to slide back towards and into the tube. System controller 500 then rotates the device staging unit 400B again to the pivot down position, turning ON vacuum to ports $S_1$-$S_4$, and repeats the device loading sequence explained above.

In the sequence explained above, when ports $S_1$-$S_4$ are inspected for vacuum, are not all vacuum confirmed, and port $S_0$ is then inspected for vacuum, the routine was explained where port $S_0$ is vacuum confirmed. If port $S_0$ is not vacuum confirmed, it is assumed there are no devices left to load. System controller 500 checks for existence of a tube in place on shelf 459. If the inspection signifies a tube is in place, it is assumed to be an empty tube, system controller 500 "pivots up" device staging station 400B, valves OFF pressure to air cylinders 465, 467, thereby retracting rods 469, 471, releasing the tube for gravity fall into a catch receptacle (not shown). System controller 500 then cycles to the tube feed routine described above. If the tube check signifies no tube is in place, system controller 500 cycles directly to the tube feed routine.

The two next preceding paragraphs described subroutines entered when vacuum was not confirmed at ports $S_1$, $S_2$, $S_3$, and $S_4$. If vacuum is confirmed at ports $S_1$, $S_2$, $S_3$, and $S_4$, controller 500 then regulates air pressure to piston 413 to retract piston 405, rotating pivot plate 421 to a level position (in which the opposite ends of slideway 475 are at the same level). FIG. 9 illustrates the position in which devices are confirmed at ports $S_1$, $S_2$, $S_3$, and $S_4$ and a stopped device is confirmed at port $S_0$.

With the devices now positioned at the foreward portion of device slideway 475 held there a vacuum applied to ports $S_1$, $S_2$, $S_3$ and $S_4$, system controller 500 regulates air pressure to rodless shuttle air cylinder 437 to drive piston 439 toward platform 24 and carry shuttle plate 445 to a position extending track 471 over a rear portion of platform 24. Controller 500 then applies pulses to loader/unloader drive motor 225 to rotate ball screw shaft 211 in ball nut 221 and thereby move connected blocks 213, 215, 217 and 219 along Y-axis shafts 207 and 209 to a start position in which the foremost load/unload head assembly 219 is situated over the foremost port $S_4$ of slideway 475. In the serial mode of operation, it is unnecessary for more than one plant load/unload head in the unit to be aligned over a specific port. The home position of the foremost head assembly and the given spacing between the successive ports of $S_1$-$S_4$ defines the linear increment which must be driven by drive motor 225 shaft rotation to sequentially align the next selected plant head e.g., plant head 217, over a next selected port, e.g. port $S_3$, and so forth.

With plant head 219 centered over port $S_4$, controller 500 valves vacuum OFF to port $S_4$, vacuum ON to the vacuum line connecting with passageway 251, 261 terminating at vacuum pad 260, and valves air pressure to chamber 252a of plant head cylinder 248, thereby extending rod 250 and attached vacuum pad 260 down into contact with the device over port $S_4$, attaching that device. The system controller then valves air pressure through line 269 to chamber 252b of plant head air cylinder 248 to retract vacuum pad assembly 257 and lift the device that was at port $S_4$ from slideway 475. System controller 500 then sends impulses to drive motor 225 to cause rotation of ball screw shaft 211 to advance the plant head unit a predetermined increment to place the plant head unit corresponding to mount 217 over vacuum port $S_3$, where the sequence described above for the foremost plant head for mount 219 is conducted, commencing with system controller 500 valving vacuum OFF to port $S_3$, to pick up the device over port $S_3$. After pickup of the device over port $S_3$, controller 500 then advances the plant head unit another predetermined increment so that the plant head connected to mount 215 is over port $S_2$, for pick up of the device over port $S_2$ the same as in the above and foregoing operation, but commencing with system controller 500 valving vacuum to port $S_2$ OFF. After the device over port $S_2$ is picked up by the head for mount 215, the plant head unit is advanced another increment and the head associated with mount 213 is positioned over port $S_1$, vacuum to port $S_1$ is valved OFF, and the operation hereinabove described is conducted to pick up the device over port $S_1$. At this point, with all devices picked up, controller 500 pulses drive motor 225 to move the plant head unit for system 200B a specific Y-axis distance along support shafts 207, 209 calculated to position foremost plant head 219 at a specific location. Controller 500 in the meantime has pulsed carrier drive motor 117 to rotate ball screw shaft 121 and drive ball nut 127 mounted to carrier plate 103 a specific X-axis distance along X-axis support shafts 60, 61 so that for the row/column spacing of sockets 11 on burn-in board 12, a specific socket is placed at an X-axis location under a predetermined Y-axis location that is the location to which the foremost head 219 of the plant head unit of 200B will be driven.

At the same time that plant head drive motor 225 drives the 200B plant head unit towards its position, controller 500 valves air to shuttle cylinder 437 to move air piston 439 rearwardly away from platform 24 and retract slideway 475 to its retracted position (FIG. 7). Device staging station 400B then again cycles through its device staging operation which terminates in extension of slideway 475 over platform 24 as hereinabove described.

With the plant head unit over the socket position determined by the system controller, the device held by vacuum pad 260 is then planted in that socket 11 on burn-in board 12. Referring to FIGS. 10-14C, system controller 500 valves air into horseshoe conduit 272 to drive the pistons in the corner bores 275-278 to the fully extended position permitted by latch rods 293, 294 thereby pushing socket lid opener 285 against socket lid 11a of socket 11 as illustrated in FIG. 14B, levering apart the spring biased socket contacts of socket 11 and allowing clearance for placement of the device held by vacuum pad 260. System controller 500 then operates to valve air to chamber 252a of air cylinder 248 to extend rod 250 a predetermined distance to place the device held by pad 260 preferably just at or above the upper surface of socket lid 11a. Controller 500 next valves OFF the vacuum to conduits 251, 261, releasing the device from pad 260 and permitting it to drop-settle into place between the spread contacts of socket base 11b. Dropping the device this short distance lets it self adjust to a centered position. With smaller devices such as the PLCC devices, controller 500 may valve additional air to chamber 252a of air cylinder 248 to extend the pad 260 into the still spread socket base and "step on" the device and hold it in place while controller 500 valves OFF the air pressure to horseshoe conduit 272, and springs 291, 292 acting respectively on guiderods 293 and 294 force guiderods 293, 294 upwardly in chambers 287, 289, thereby retracting socket lid opener 285 and permitting socket lid 11a to rise and press the spring loaded contacts within socket 11 onto the leads of the captured device, capturing the device in the socket. With the device securely sequestered within the socket, controller 500 then valves air to chamber 252b of cylinder 248, forcing piston 251 and rod 250 upwardly and withdrawing pad 260 from within the socket to its fully raised position. With larger devices such as SOIC or PQFP devices, there is less need to "step on" the device during release of the socket lid, and the step of further extending the pad 260 may be omitted. Drive motor 225 is then actuated to advance the plant head unit of 200A a predetermined increment to situate the plant head for mount 217 over the next socket 11 calculated to be filled by the computer, and the device planting cycle described above for the foremost plant head is implemented, and so forth, until all devices from the plant heads have been planted and all plant head piston rods are in a retracted position. The plant head unit is then returned to the "in" pickup position by the controller, which cycles the pick-up device routine as described above.

Unloading Operation

In the operation of station B to unload devices from the sockets 11 of burn-in board 12, first, emptied tubes for the devices are loaded by tube transport mechanism 300B onto device staging system 400B the same as in the loading operation described above. With the emptied tubes loaded onto tube shelf 459 (the first loaded tube hereinafter is also called tube 1), system controller 500 applies pulses to loader/unloader drive motor 225 to rotate ball screw shaft 211 and ball nut 221 and thereby move connected blocks 213, 215, 217 and 218 along Y-axis shafts 207 and 209 to a start position in which a selected one of the plant heads, for example the plant head associated with mount 219, is situated over a specific location along the X-axis of carrier 103. Controller 500 then pulses carrier drive motor 117 to rotate ball screw shaft 121 and drive ball nut 127 mounted to carrier plate 103 a specific X-axis distance along X-axis support shafts 60, 61 so that for the row column spacing of sockets 11 on burn-in board 12, a specific socket is placed under the Y-axis position of plant head 219. With the selected plant head over the socket position determined by the controller 500, the plant head is operated to pick up the device from the socket. Referring to FIGS. 10-14C, controller 500 valves air into horseshoe conduit 272 to drive the pistons in the corner bores 275-278 to the fully extended position permitted by latch rods 293, 294 thereby pushing socket lid opener 285 against socket lid 11a of socket 11 as illustrated in FIG. 14B. This levers apart the socket spring biased contacts, freeing the device in socket 11 from the grasp imposed by the contacts. Controller 500 then valves vacuum to vacuum lines 251 and 261, and valves air pressure to chamber 252a of air cylinder 248 to extend rod 250 a predetermined distance to place vacuum pad 260 on the device resting free in the socket base 11, capturing the device with the vacuum applied at pad 260. Controller 500 next valves air to chamber 252b of air cylinder 248 to retract rod 250 and remove the device from socket 11. Controller 500 next conducts a inspection routine to inspect that the device is attached by confirming vacuum (and if absence of vacuum is determined, repeats the routine to apply vacuum to the plant head, depress the socket lid, extend the piston rod with vacuum pad into the socket, attach the device, and retract the rod, after which it again inspects for device attachment, and if not then detected, sounds a sonic alarm). Upon confirmation of vacuum, the microprocessor then valves OFF the air pressure to horseshoe conduit 272 so that springs 291 and 292 force guiderods 293 and 294 upwardly in chambers 287 and 289, retracting socket lid opener 285, and permitting socket lid 11 to close. Controller 500 then actuates drive motor 225 to advance the plant head unit a predetermined increment to situate another of the plant heads over another socket, whose location is calculated by the controller 500, and the device unloading cycle described above for the foremost unit is conducted, and so forth, until all the plant head have picked up devices from sockets for which they are targeted. Controller 500 then pulses plant head drive motor 225 to drive the plant head group unit of 200B to an unloading position where controller 500 has positioned slideway 475 by valving air to rodless air cylinder 437 to extend slideway 475 to its forward position. Controller 500 then valves ON vacuum to ports $S_0$, $S_1$, $S_3$, and $S_4$. Controller 500 next valves air pressure to a selected one of the plant heads, for example, the plant head associated with bearing block 219, and thereby extends piston rod 250 and lowers vacuum pad 260 containing the attached device until it is immediately over a selected vacuum port, for example, $S_4$. Controller 500 then valves cap OFF vacuum to lines 251 and 261 to vacuum pad 260, releasing the device to port $S_4$, where it is vacuum captured and held at port $S_4$. Controller 500 then directs air pressure to chamber 252b to cause retraction of plant head rod 250. Next controller 500 pulses plant head drive motor 225 a predetermined increment to situate a next selected plant head over a next selected vacuum port on slideway 475 and repeats the foregoing cycle to deposit the device held by the vacuum pad of that plant head, and so forth, until all device are loaded on all of the ports $S_1$, $S_2$, $S_3$, and $S_4$. At this point, controller 500 pulses plant head drive motor 225 to drive the plant head unit to a next calculated position over carrier 103 to resume the unload routine, and valves air to rodless cylinder 437 to retract shuttle plate 445 and slideway 475. Controller 500 the valves air to air cylinders 407 and 409 to retract rods 405, 411 and cause pivot plate 421 and device staging system 400B to "pivot up" (tube down), at the same time turning OFF the vacuum to ports $S_1$, $S_2$, $S_3$ and $S_4$, releasing the devices from the slideway ports and permitting them to slide down the inclined slideway into the tube held by tube loader shelf 459. A preferred "pivot up" angle is about 30 degrees. Controller 500 then directs air to air cylinder 409 to pivot plate 421 and device staging system 400B to a level position, and next applies air to shuttle rodless air cylinder 437 to extend slideway 475 for receipt of devices unloaded by the plant head units that have been retrieving more devices while devices unloaded in the prior cycle were being loaded into a tube.

BIB Loading/Unloading from Tray

Some IC devices are packed by the manufacturer in trays instead of tubes. In trays the devices usually are placed in recesses arranged in a specific pin one orientation in a grid of rows and columns with protective packaging to prevent shifting. The apparatus of this invention may be used to load and unload burn-in boards from trays as well as tubes. The tray to be unloaded is placed on a holder plate (not shown) which is accepted by guide rails 145, 147 (for example). The holder plate secures the tray in fixed position with pin one orientation as desired. Tray row-column spacing information is input by computer keyboard 502. System controller 500 controls drive motor 116 to move carrier plate 102 to its left most position and parks it. Controller 500 then pulses drive motor 117 to move carrier 103 to the left, moving the tray captured between guide rails 145, 147 to beneath station 200B. System controller 500 pulses drive motor 225 to move a selected plant head 244, for example, the one attached to block mount 213, to position over a device on the tray. Controller 500 valves air to chamber 252a of air cylinder 248, thereby extending rod 250 and attached vacuum pad 260 down into contact with the device in the tray, attaching that device. The system controller then valves air pressure through line 269 to chamber 252b of plant head air cylinder 248 to retract vacuum pad assembly 257 and lift the device from the tray. System controller 500 then sends impulses to drive motor 225 to cause rotation of ball screw shaft 211 to advance the plant head unit a predetermined increment to place the plant head unit corresponding to mount 215 over the next adjacent device in the tray, where the sequence described above for the foremost plant head for mount 213 is conducted. After pickup of the next device in the tray, controller 500 then advances the plant head unit another predetermined increment so that the plant head connected to mount 217 is the second next device in the tray, for pick up of that device the same as in the above and foregoing operation. After the second next device in the tray is picked up by the head for mount 215, the plant head unit is advanced another increment and the head associated with mount 219 is positioned over the third next device in the tray, and the operation hereinabove described is conducted to pick up the third next device in the tray. At this point, with four devices picked up, controller 500 pulses drive motor 117 to move the carrier plate 103 to the right a specific X-axis distance along support shafts 60, 61 calculated to position the burn-in board 12 between guide rails 143, 145 at a specific location under the plant head unit of system 200B. With the plant head unit over the desired row/column of burn-in board 12, the devices are planted in the row/column sockets of burn-in board 12 as described above. The carrier 103 is then moved to position another group of devices on the tray, under the plant heads, and if necessary because of the location on the tray of the next group of devices to be removed from the tray, plant head unit 200B is moved on its Y-axis, and the tray unloading step is performed again, and so forth, until the tray is unloaded and the burn-in board is filled. Unloading of burn-in board 12 and loading to the tray is the reverse operation of unloading the tray and loading the burn-in board.

Having now detailed my invention in both its apparatus and process aspects, those skilled in the arts will appreciate various modifications of my invention, and those modifications, though not described in the detailed embodiment set forth above, are covered if within the spirit and scope of my invention.

I claim:

1. An apparatus for loading parts into a receiving opening on a workpiece, comprising:
    a support;
    carrier means moveably affixed to the support for carrying a workpiece horizontally in only a first horizontal straight line axial direction; and pickup and place means moveably affixed to the support and including a plurality of vertically acting pick and place members aligned and movable in a second horizontal straight line axial direction perpendicular to said first axial direction, for (i) vertically picking up one or more parts, (ii) horizontally carrying said one or more parts above said carrier means in said second axial direction, and (iii) vertically placing said one or more parts each into separate receiving openings along said second axial direction and on the workpiece.

2. An apparatus for loading IC devices into sockets on printed circuit boards, comprising:

a support;

a carrier moveably affixed to said support and having a horizontally disposed plate and co-acting holders operatively connected to said plate for releasably holding a printed circuit board having sockets horizontally to said plate;

carrier drive means affixed to said support and coupled to said carrier for moving said carrier to positions along a first horizontal axial direction;

a plurality of vertically acting pickup and place members movably affixed to said support and aligned and movable along a second horizontal axial direction perpendicular to said first horizontal axial direction;

pickup and place members drive means affixed to said support and coupled to said pickup and place members to move said members over said carrier;

control system means for receiving input signals from, and communicating output signals to, said apparatus, including control means for controlling said carrier drive means to drive said carrier to a place where a selected one of said sockets on said printed circuit board is in a predetermined position having a coordinate along said first horizontal axial direction and for controlling said pickup and place members drive means to drive said members to a place where a selected one of such members is at a predetermined position along said second axial direction having said coordinate and along said first axial direction;

an elongated slideway having first and second end portions and pivotally affixed to said support about a pivot axis parallel to said first axis, said slideway being pivotable at least to a first pivot position in which said first end portion is lower than said second end portion and to a second pivot position in which said first and second end portions are the same level.

3. The apparatus of claim 2 further comprising receiver means operatively associated with said second end portion of said slideway for receiving a tubular container for IC devices in longitudinal orientation with said slideway such that, with said slideway in said first position, devices in the container slide from the container down said slideway by force of gravity.

4. The apparatus of claim 3 further comprising container tube transport means connected to said support and operatively associated with said receiver means, for transporting a plurality of IC device container tubes for presentation one at a time to said receiving means at such times as the receiving means does not hold an IC device container tube.

5. The apparatus of claim 3 in which said slideway is pivotable to a third position in which said second end portion is lower than said first end portion.

6. The apparatus of claim 3 comprising a plurality of vacuum ports longitudinally arrayed in said first end portion of said slideway and means for applying a vacuum to said ports.

7. The apparatus of claim 6 comprising a gating vacuum port in said slideway between said second end portion and said plurality of ports in said first end portion and means for applying vacuum to said ports.

8. The apparatus of claim 6 or 7 in which the number of vacuum ports in said first end of the slideway equals the number of pickup and place members.

9. An apparatus for loading parts into and unloading parts from receiving openings in columns perpendicularly intersecting rows on the horizontal surface of a workpiece, comprising:

a support;

carrier means moveably affixed to said support including a workpiece carrier for carrying said workpiece horizontally along a first horizontal straight line of movement; and pickup and place means moveably affixed to the support and including a plurality of vertically acting pick and place members (a) aligned side-by-side in a second horizontal straight line which is perpendicular to said first line and (b) moveable along said second line over said workpiece carrier, for (i) vertically picking up one or more parts from a first place along said second line, and (ii) vertically placing said one or more parts in a second place along said second line; one of said first and second places being receiving openings on said workpiece.

10. An apparatus for loading parts into and unloading parts from receiving openings in columns perpendicularly intersecting rows on a horizontal surface of a workpiece, which comprises:

a support;

carrier means moveably affixed to said support for carrying said workpiece horizontally along a first horizontal straight line of movement;

pickup and place means moveably affixed to said support and including a plurality of vertically acting pick and place members (a) aligned side-by-side in a second horizontal straight line which is perpendicular to said first line and (b) moveable along said second line over said workpiece carrier, for (i) vertically picking up one or more parts from a first place along said second line, and (ii) vertically placing said one or more parts in a second place along said second line, one of said first and second places being receiving openings on said workpiece; and staging means including a longitudinal straight slideway having first and second end portions, said staging means being pivotally connected to said support and pivotable at least to a first position in which said first end portion is lower than said second end portion, for gravity feeding parts from said second end of said slideway to said first end of said slideway when said slideway is pivoted to said first position.

11. The apparatus of claim 9 or 10 in which said places are spaced apart along said second line.

12. The apparatus of claim 9 or 10 in which said places are spaced apart on said carrier means along said first line.

13. The apparatus of claim 10 further comprising control system means operatively associated with said carrier means, said pickup and place means and said staging means, for controlling operation of said carrier means, said pickup and place means and said staging means.

14. The apparatus of claim 1 in which said staging means includes a gating vacuum port in said slideway between said second end portion and said plurality of ports in said first end portion for gating devices to said plurality of ports in said first end position.

15. The apparatus of claim 10 in which said slideway is pivotable to a second position at which said first and second end portions are at the same level, and in which said pickup and place means is positionable along said second line to vertically pick up one or more parts from said first end portion of said slideway when said slideway is in said second position.

16. The apparatus of claim 15 or 10 in which said staging means includes a plurality of vacuum ports arrayed longitudinally in said first end portion of said slideway and means for applying a vacuum to said ports to hold in position parts located over said ports.

17. The apparatus of claim 6 in which said staging means includes receiving means operatively associated with said second end portion of said slideway for receiving and holding an elongated container of parts in longitudinal orientation with said slideway such that, with said slideway in said first position, parts in said container slide from the container down said slideway by force of gravity.

18. The apparatus of claim 17 in which said staging means includes a plurality of vacuum ports arrayed longitudinally in said first end portion of said slideway and means for applying a vacuum to said ports to arrest parts sliding down the slideway when the slideway is in said first position and to hold in position the parts over said ports.

19. The apparatus of claim 18 in which said staging means includes a gating vacuum port in said slideway between said second end portion and said plurality of ports in said first end portion for gating devices to said plurality of ports in said first end position.

20. The apparatus of claim 16 in which said pickup and place members equal in number the number of said vacuum ports in said first end portion of said slideway.

21. The apparatus of claim 19 in which said pickup and place members equal in number the number of said vacuum ports in said first end of said slideway.

22. The apparatus of claim 9 or 10 in which said pickup and place members each include an air cylinder each having a piston rod and extendible vertically downward, each said end having means affixed thereto for releasably attaching a said part.

23. The apparatus of claim 22 in which said part is an IC device, said workpiece is a printed circuit board and said receiving opening is an IC device socket, and wherein each said pickup and place member further includes, below each said air cylinder, a socket opener portion having a central passageway through which said piston rod end is extendible, said socket opener portion being extendible to depress a socket lid of a zero insertion force socket on said printed circuit board for vertical placement of an IC device through said passageway and through a central aperture of said socket lid into a socket base of the socket.

24. The apparatus of claim 10 in which said part is an IC device, said workpiece is a printed circuit board and said receiving opening is an IC device socket, and wherein the carrier means includes co-acting holders operatively connected to said workpiece carrier for releasably fixedly holding the printed circuit board horizontally to said workpiece carrier, and further includes printed circuit board supports operatively connected to said workpiece carrier between said co-acting holders for supporting the underside of the printed circuit board when the board is fixedly held horizontally to said workpiece carrier.

25. The apparatus of any of claims 17, 18, 19 or 21 in which said part is an IC device, said workpiece is a printed circuit board, and said receiving opening is a socket, and further comprising IC devices container tube transport means connected to said support and operatively associated with said staging means for transporting a plurality of IC device container tubes one at a time to said receiving means of the device staging means at such times as the staging means does not hold an IC device container tube.

26. The apparatus of claim 13, in which said carrier means includes means for horizontally releasably affixing said workpiece on said workpiece carrier and further includes means responsive to signals from said control system for positioning said workpiece carrier in a predetermined position along said first horizontal straight line.

27. The apparatus of claim 26 or 13 in which said pickup and place means includes means responsive to signals from said control system for positioning at least one of said members at a predetermined position along said second horizontal straight line.

28. The apparatus of claim 10 in which said pickup and place means includes means for extracting parts from receiving openings on said workpiece and placing the parts on said slideway when the slideway is in said second position, and in which said staging means is pivotable to a third position in which said second end is lower than said first end.

* * * * *